(12) United States Patent
Murata

(10) Patent No.: US 6,795,458 B2
(45) Date of Patent: Sep. 21, 2004

(54) LASER DIODE CONTROL CIRCUIT AND LASER DIODE CONTROL METHOD

(75) Inventor: Hiroshi Murata, Osaka (JP)

(73) Assignee: Sumitomo Electric Industries, Inc., Osaka (JP)

(*) Notice: Subject to any disclaimer, the term of this patent is extended or adjusted under 35 U.S.C. 154(b) by 0 days.

(21) Appl. No.: 10/351,459

(22) Filed: Jan. 24, 2003

(65) Prior Publication Data
US 2003/0165168 A1 Sep. 4, 2003

(30) Foreign Application Priority Data
Jan. 24, 2002 (JP) ........................................ 2002-016111

(51) Int. Cl.[7] ................................................. H01S 3/00
(52) U.S. Cl. ........................................ 372/26; 372/38.02
(58) Field of Search ......................... 372/26, 29.01–32, 372/38.02

(56) References Cited

U.S. PATENT DOCUMENTS

| | | | |
|---|---|---|---|
| 4,884,278 A | * | 11/1989 | Nishimoto et al. ............. 372/26 |
| 5,309,269 A | * | 5/1994 | Shibao ....................... 398/197 |
| 5,311,005 A | * | 5/1994 | Visocchi ...................... 250/205 |
| 5,337,323 A | * | 8/1994 | Rokugawa et al. ............. 372/31 |
| 5,394,416 A | * | 2/1995 | Ries ............................ 372/26 |

FOREIGN PATENT DOCUMENTS

JP 2001-197014 7/2001

* cited by examiner

Primary Examiner—Quyen Leung
(74) Attorney, Agent, or Firm—Fish & Richardson P.C.

(57) ABSTRACT

A laser diode control circuit comprises a load portion, a control portion, a bias current circuit portion, and a modulation current circuit portion. The load portion generates a signal $V_1$ which corresponds to a photocurrent corresponding to an amount of light received in a monitoring photodetector for receiving light from a laser light generating portion. The control portion generates first and second control signals $V_2$, $V_3$ from a value Db, a value Dm, an amount of change $\Delta Dm$, and an amount of change $\Delta Db$. The amount of change $\Delta Dm$ is generated using a function $f(Db, \Delta Db) = \Delta Dm$ which is defined such that the light emission power and the extinction ratio become constant. The first control signal $V_2$ is generated from $\Delta Db$ and Db in order to modify a bias current Ib, whereas the second control signal $V_3$ is generated from values corresponding to $\Delta Dm$ and Dm in order to modify a modulation current Im.

26 Claims, 17 Drawing Sheets

BIAS CURRENT

BIAS CURRENT

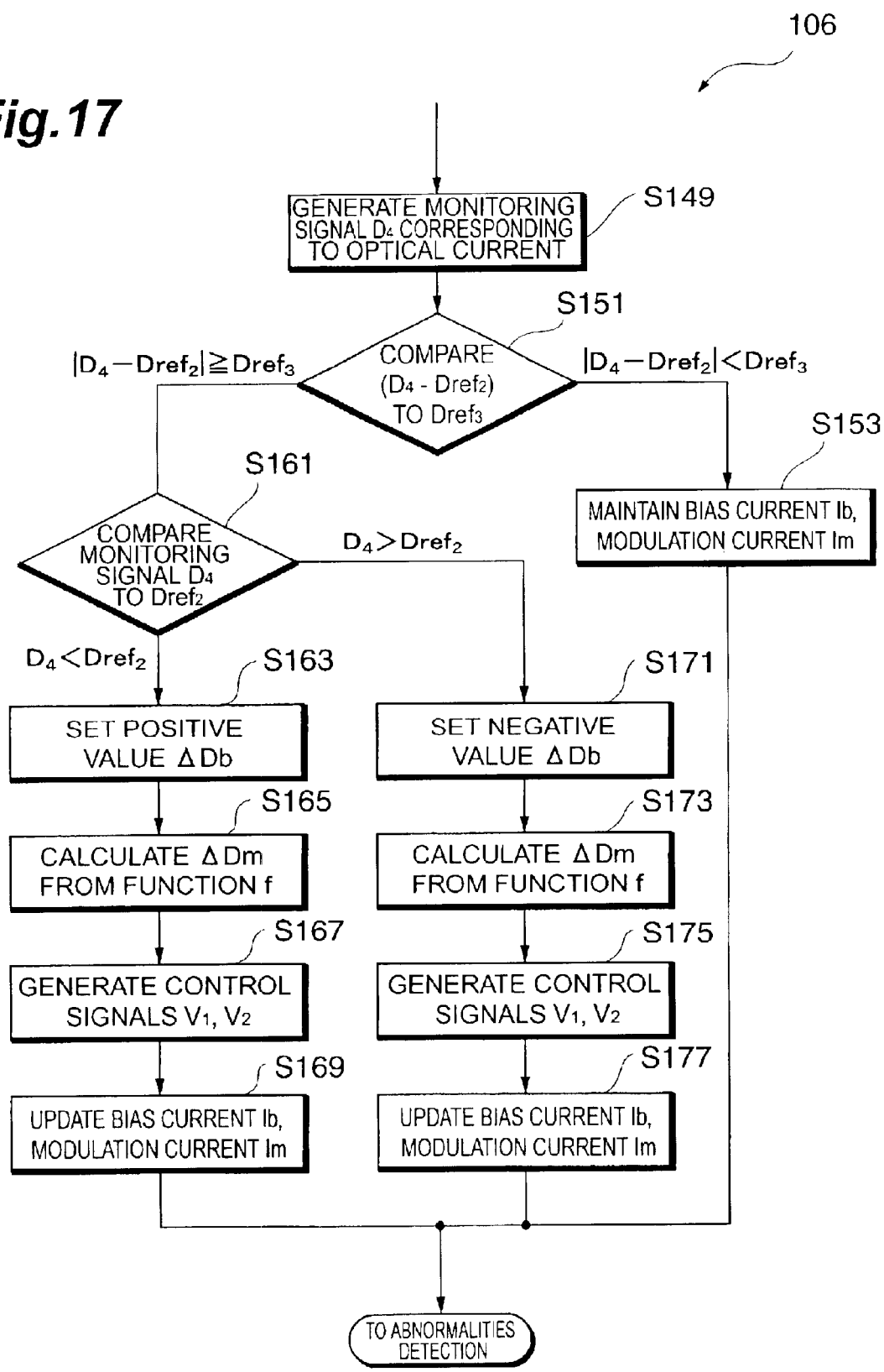

LASER DIODE CONTROL CIRCUIT AND LASER DIODE CONTROL METHOD

BACKGROUND OF THE INVENTION

1. Field of the Invention

The present invention relates to a laser diode control circuit and a laser diode control method.

2. Related Background Art

An optical transmitter comprises a semiconductor laser and a laser driving circuit. In the field of optical communications, a semiconductor laser is driven by a laser driving circuit to generate signal light corresponding to a transmission signal.

SUMMARY OF THE INVENTION

The present inventors have performed research into the control of semiconductor lasers. In this research, the inventors investigated semiconductor laser control methods. As a result of this investigation, the following clarifications were made.

In a first technique, the optical output power and extinction ratio of a semiconductor laser are controlled by detecting the average value and peak value of a monitoring photodetector. However, according to the investigations of the inventors, it was learned that when the optical signal transmission rate increases, it becomes difficult to operate the monitoring photodetector at a high enough speed to detect the peak value in the received optical signal.

In a second technique, a control circuit converts the output of the monitoring photodetector into a digital value using an A/D converter and subtracts this digital value from a reference value stored in memory. The control circuit converts the subtracted value into an analog value using a D/A converter and controls the semiconductor laser on the basis of this analog value. In this controlling technique, an optimum modulation current value for each temperature is stored in memory and the extinction ratio is held at a constant level on the basis of this value. In this technique, for the purposes of control, the modulation current value is determined uniquely using a signal from a thermistor for detecting ambient temperature, and the bias current is determined such that the average power is maintained at a constant level. However, it was learned from the investigations of the inventors that in this technique, when the luminous efficiency decreases due to deterioration in the laser light generating portion over time, only the bias current is increased. Thus the extinction ratio cannot be maintained at a constant level.

In a third technique, the bias current, the modulation current, and an initial value for the monitoring photodetector in respect of the usage range temperature are stored in memory, and the modulation current and bias current are determined using a signal based on the result of a comparison between a signal from the monitoring photodetector and the values stored in the memory. In this technique, the modulation current and bias current are determined using a signal from a temperature sensor. However, according to the investigations of the inventors, it is impossible with this technique to compensate for changes due to deterioration of the semiconductor laser over time.

According to these investigations, it was discovered that technical problems exist in conventional techniques such that a technique for controlling the optical output power of a semiconductor laser toward a predetermined value and a technique for controlling the extinction ratio of a semiconductor laser toward a predetermined value have not been achieved.

It is therefore an object of the present invention to provide a laser diode control circuit and laser diode control method for performing control of the optical output power and extinction ratio of a laser light generating portion having a semiconductor light source.

A first aspect of the present invention relates to a laser diode control circuit. The laser diode control circuit comprises a load portion, a control portion, a bias current circuit portion, and a modulation current circuit portion. The load portion generates a signal corresponding to a photocurrent which is generated by a photodetector in accordance with the optical power of the light received from a laser light generating portion. The control portion generates a first control signal for modifying one of a bias current and a modulation current and a second control signal for modifying the other of the bias current and modulation current from among a value X, a value Y, an amount of change $\Delta X$ in relation to the value X, and an amount of change $\Delta Y$ in relation to the value Y. The first control signal is generated from $\Delta Db$ and a value corresponding to Db. The second control signal is generated from $\Delta Dm$ and a value corresponding to Dm. The amount of change $\Delta Y$ is generated by a function $f(X, \Delta X) = \Delta Y$ which is defined such that the light emission power displays a predetermined dependence and the extinction ratio displays a predetermined dependence. A set of variables $(X, Y, \Delta X, \Delta Y)$ is either $(Db, Dm, \Delta Db, \Delta Dm)$ or $(Dm, Db, \Delta Dm, \Delta Db)$, the symbol Db indicating a value corresponding to a bias current Ib, the symbol Dm indicating a value corresponding to a modulation current Im, the symbol $\Delta Db$ indicating a value corresponding to an amount of change $\Delta Ib$ in the bias current Ib, and the symbol $\Delta Dm$ indicating a value corresponding to an amount of change $\Delta Im$ in the modulation current Im. The bias current circuit portion is connected to the laser light generating portion and generates a bias current in accordance with the first control signal. The modulation current circuit portion is connected to the laser light generating portion and generates a modulation current in accordance with the second control signal.

In order to control the bias current and modulation current in this control circuit, the amount of change $\Delta Y$ is generated by a function $f(X, \Delta X) = \Delta Y$ in relation to a set of variables $(X, Y, \Delta X, \Delta Y) = (Db, Dm, \Delta Db, \Delta Dm)$ or $(X, Y, \Delta X, \Delta Y) = (Dm, Db, \Delta Dm, \Delta Db)$, and hence a control circuit which is capable of control such that the light emission power displays a predetermined dependence and the extinction ratio displays a predetermined dependence is provided.

In the laser diode control circuit, the function f may be constituted as an approximated function of a function defined such that the light emission power becomes constant and the extinction ratio becomes constant.

In the laser diode control circuit, the control portion may be constituted so as to comprise first means, second means, and third means. The first means generates the amount of change $\Delta Y$ in accordance with the function $f(X, \Delta X) = \Delta Y$ and in accordance with the amount of change $\Delta X$ which is determined according to the result of a comparison between a value corresponding to the signal which corresponds to the photocurrent and a reference value. The second means generates the first control signal from values corresponding to $\Delta Db$ and Db. The third means generates the second control signal from values corresponding to $\Delta Dm$ and Dm.

In the laser diode control circuit, the first means may comprise nonvolatile memory. The laser diode control circuit may further comprise an interface portion for communicating with an external device and means connected to the interface portion for performing a write operation to the nonvolatile memory. According to this constitution, the laser diode control circuit can be adjusted via the interface portion. For example, by providing the interface portion, the amount of labor required for each individual adjustment operation in the laser diode driving circuit can be reduced in comparison with manual adjustments. Further, when the characteristic data for each laser diode are stored in an external device which is a computer, adjustments can be performed in alignment with the characteristic data.

In the laser diode control circuit, first storage means may store a constant $(\Delta Y/\Delta X)_o$ in relation to the entire range of the variable X. This constitution is easily realized and allows a reduction in the circuit scale and the number of processing steps.

In the laser diode control circuit, the first storage means may store a constant $(\Delta Y/\Delta X)_n$ in association with each of a plurality of regions ($R_n$: $n \geq 1$) into which the entire range of the variable X is divided. This constitution is comparatively easy to realize and also allows the light emission power and extinction ratio to be held to predetermined characteristics in a wide temperature range regardless of using a simple approximated function.

In the laser diode control circuit, the first means may comprise first generating means, comparing means, second generating means, and third generating means. The first generating means generates a value $(\Delta Y/\Delta X)_m$ which is calculated from a linear function f in relation to X in an arbitrary region $R_m$ from among the plurality of regions ($R_m$: $m \geq 1$) into which the entire range of the variable X is divided. The comparing means compares a monitoring signal corresponding to the photocurrent value with a reference value. The second generating means determines the value $\Delta Y$ on the basis of the value of $(\Delta Y/\Delta X)_m$ and on the basis of a value of $\Delta X$ which is set such that the optical power of the light increases when the comparison result in the comparing means indicates that the optical power of the light is smaller than a predetermined value. The third generating means determines the value $\Delta Y$ on the basis of the value of $(\Delta Y/\Delta X)_m$ and on the basis of a value of $\Delta X$ which is set such that the optical power of the light decreases when the comparison result indicates that the optical power of the light is larger than a predetermined value. This constitution is comparatively easy to realize and allows the light emission power and extinction ratio to be held to predetermined characteristics in a wide temperature range with a high degree of precision.

In the laser diode control circuit, the control portion may comprise means for comparing any one of Db, Dm, or the sum SUM of Db and Dm with a threshold, and generating a first comparison signal indicating the result of this comparison, and means for generating a first alarm signal indicating the presence of an overcurrent in the laser light generating portion when this first comparison signal indicates that the current is excessive high. Thus deterioration of and breakdowns in the laser light generating portion can be detected. The control portion may also comprise means for halting the first alarm signal on condition that the first comparison signal indicates a normal current when the first alarm signal is being asserted.

In the laser diode control circuit, the control portion may comprise means for comparing a monitoring signal which corresponds to the photocurrent with a threshold, and generating a third comparison signal which indicates the result of this comparison, and means for generating a second alarm signal indicating a decrease in light emission power in the laser light generating portion when the third comparison signal indicates excessively low power. Thus deterioration of and breakdowns in the laser light generating portion can be detected. The control portion may also comprise means for halting the second alarm signal on condition that the third comparison signal indicates normal power when the second alarm signal is being asserted.

By using both the first comparison signal and the third comparison signal, a state of deterioration in which a predetermined optical power is generated but the power supply is excessively large may be differentiated from a state of breakdown in which light is not emitted, for example. Thus, unforeseen breakdowns of the system can be avoided and as a result the optical module can be replaced in advance, prior to a breakdown.

The laser diode control circuit may further comprise an interface portion for communicating with an external device, means for halting the generation of light in the laser light generating portion in response to a signal from the interface portion, and means for commencing the generation of light in the laser light generating portion in response to a signal from the interface portion. According to these means, the output of light can be halted when disconnection of an optical connector is detected, and thus the danger of laser light leakage can be avoided. Further, since the output of light can be commenced and halted intentionally, transmission in an optical fiber, for example, can be ensured.

Another aspect of the present invention relates to a laser diode control method. This method comprises the steps of: (a) generating a signal which corresponds to a photocurrent from a monitoring photodetector for receiving light from a laser light generating portion; (b) generating a first control signal using $\Delta X$ and X for controlling one of the bias current and the modulation current and generating a second control signal using $\Delta Y$ and Y for controlling the other of the bias current and the modulation current from among a value X, a value Y, a variable $\Delta X$ which is defined in accordance with the result of a comparison between a value corresponding to this signal and a reference value, and a value $\Delta Y$ which is generated by a function $f(X, \Delta X)=\Delta Y$ defined such that the light emission power displays a predetermined dependence and the extinction ratio displays a predetermined dependence; and (c) driving the laser light generating portion using the bias current and modulation current generated on the basis of the first and second control signals. A set of variables (X, Y, $\Delta X$, $\Delta Y$) is one of either (Db, Dm, $\Delta$Db, $\Delta$Dm) or (Dm, Db, $\Delta$Dm, $\Delta$Db). The symbol Db indicates a value corresponding to a bias current Ib, the symbol Dm indicates a value corresponding to a modulation current Im, the symbol $\Delta$Db indicates a value corresponding to an amount of change $\Delta$Ib in the bias current, and the symbol $\Delta$Dm indicates a value corresponding to an amount of change $\Delta$Im in the modulation current.

In this laser diode control method, the generating step (b) may comprise the steps of: (d) comparing the absolute value of the difference between the value corresponding to the signal and the reference value with a predetermined value; (e) when this absolute value exceeds the predetermined value, generating the first control signal using $\Delta X$ and X for controlling one of the bias current and the modulation current and generating the second control signal using $\Delta Y$ and Y for controlling the other of the bias current and the modulation current wherein the value $\Delta X$ is defined in accordance with the result of a comparison between the value corresponding to the signal and the reference value, the value ΔY is generated by the function f(X,ΔX)=ΔY defined such that the light emission power displays a predetermined dependence and the extinction ratio displays a predetermined dependence; and (f) when this absolute value is equal to or less than the predetermined value, maintaining the first and second control signals. According to this method, wavering of the bias current and modulation current can be reduced.

According to these inventions, a laser diode control circuit and a laser diode control method for performing control of the optical output power and extinction ratio of a laser light generating portion comprised in a semiconductor light source are provided.

The aforementioned object and other objects, features, and advantages of the present invention will become clearer from the detailed description in the following preferred embodiments of the present invention which will progress with reference to the attached drawings.

However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 7A is a view illustrating a data structure of first storage means 36a;

FIG. 17 is another flowchart illustrating a bias current and modulation current control procedure.

DESCRIPTION OF THE PREFERRED EMBODIMENTS

Figure 1:
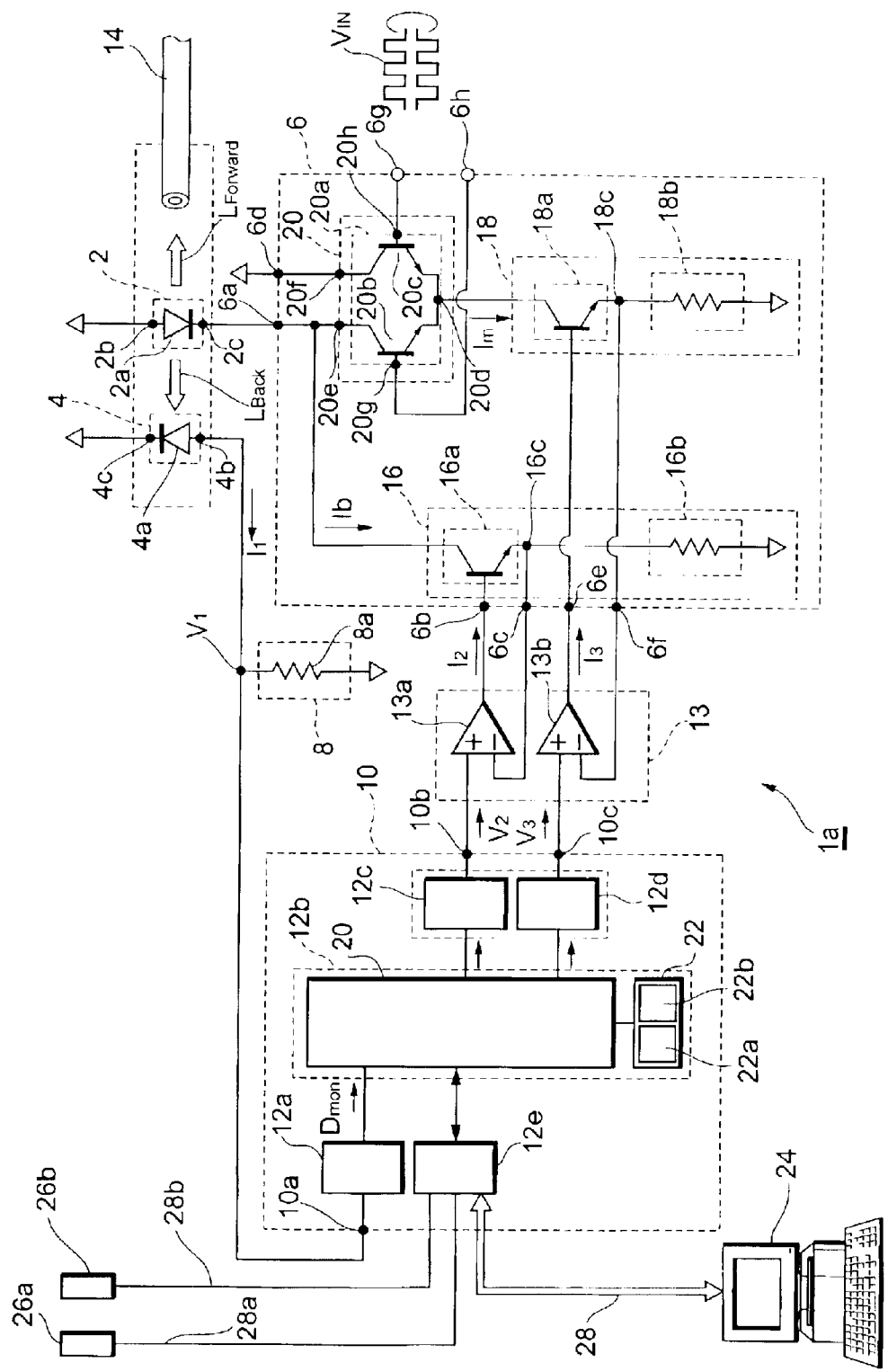
FIG. 1 is a block diagram illustrating a laser diode control circuit according to an embodiment of the present invention.

The present invention can be simply understood upon consideration of the attached drawings and the following detailed description. Wherever possible, identical reference numbers have been used to indicate identical elements in the drawings.

First Embodiment

FIG. 1 is a block diagram illustrating a laser diode control circuit according to an embodiment of the present invention. A laser diode control circuit 1a comprises a driving circuit 6, a load portion 8, a control portion 10, and a bias current and modulation current control circuit 13.

The laser diode control circuit 1a may further comprise a laser light generating portion 2 and a monitoring photodetector 4. The laser light generating portion 2 includes a semiconductor light source which is a semiconductor laser element 2a. The semiconductor laser element 2a comprises an anode 2b and a cathode 2c. The semiconductor laser element 2a is also provided with one end face and another end face, and this one end face and other end face form an optical resonator. The laser light generating portion 2 is optically coupled to an optical waveguide 14 which is an optical fiber, and light $L_{Forward}$ from the laser light generating portion 2 is provided to this optical waveguide 14. The monitoring photodetector 4 is optically coupled to the laser light generating portion 2 and is disposed to receive light $L_{Back}$ from the laser light generating portion 2. The monitoring photodetector 4 is not limited thereto, however, and may receive a portion of the light $L_{Forward}$. The photodetector 4 also produces a photocurrent $I_1$ which corresponds to the amount of received light of the light from the laser light generating portion 2. For example, the photodetector 4 comprises a semiconductor photodetector which is a photodiode 4a. The photodiode 4a is provided with an anode 4b and a cathode 4c.

The load portion 8 is connected to the photodetector 4, and produces a load voltage $V_1$ corresponding to the photocurrent $I_1$. The load portion 8 also comprises a resistance element 8a which serves as a resistor. The control portion 10 receives the load voltage $V_1$ via an input 10a, and in response to this voltage operates to generate a first control signal $V_2$ for modifying a bias current $I_b$ and a second control signal $V_3$ for modifying a modulation current Im. The control portion 10 also comprises an A/D conversion circuit portion 12a, control means 12b, a first D/A conversion circuit portion 12c, a second D/A conversion circuit portion 12d, and an interface portion 12e. The A/D conversion circuit portion 12a comprises an A/D converter which receives the load voltage $V_1$ via the input 10a to thereby generate a digital value $D_{mon}$ which corresponds to the load voltage $V_1$. The control means 12b comprises means for realizing the functions $f(D_b, \Delta D_b)=\Delta D_m$ or $f(D_m, \Delta D_m)=\Delta D_b$, which are defined such that the light emission power shows a predetermined dependence and the extinction ratio shows a predetermined dependence. The symbol $D_b$ indicates a digital value corresponding to the bias current $I_b$, the symbol $D_m$ indicates a digital value corresponding to the modulation current $I_m$, the symbol $\Delta D_b$ indicates a digital value corresponding to the amount of change $\Delta I_b$ in the bias current, and the symbol $\Delta D_m$ indicates a digital value corresponding to the amount of change $\Delta I_m$ in the modulation current. In this embodiment, the first D/A conversion circuit portion 12c generates the first control signal $V_2$ (analog value) from a value corresponding to $\Delta Db+Db$ (digital value). The second D/A conversion circuit portion 12d generates the second control signal $V_3$ (analog value) from a value corresponding to $\Delta Dm+Dm$ (digital value). If internal processing of the control portion is performed by digital control, then it is possible to eliminate processing errors due to variation in temperature and in power supply voltage. Further, complex control may be performed accurately.

This control circuit 1a uses the function f to control the bias current Ib and modulation current Im. This function f displays a response to the signal from the photodetector 4 and is defined such that the light emission power shows a predetermined dependence and the extinction ratio shows a predetermined dependence.

In the control means 12b of the laser diode control circuit 1a, the function f may be constituted as an approximated function in respect of the function which is defined such that the light emission power and extinction ratio become constant. A preferable embodiment of the functions f is as a function which is defined such that the light emission power becomes constant and the extinction ratio becomes constant.

The bias current and modulation current control circuit portion 13 comprises a bias current control circuit 13a and a modulation current control circuit 13b. The bias current control circuit 13a receives the first control signal $V_2$ to generate a signal $I_2$ for controlling the bias current circuit. The bias current control circuit 13a may comprise an operational amplifier with V+ input and V− input. The V+ input receives the first control signal $V_2$. The V− input receives a feedback signal from the bias current circuit portion. The modulation current control circuit receives the second control signal $V_3$ to generate a signal $I_3$ for controlling the modulation current circuit. The modulation current control circuit 13b may comprise an operational amplifier with V+ input and V− input. The V+ input receives the second control signal $V_3$. The V− input receives a feedback signal from the modulation current circuit portion.

The driving circuit 6 comprises a bias current circuit portion 16, a modulation current circuit portion 18, and a driving portion 20. The bias current circuit portion 16 comprises a bias current generating portion 16a and a fluctuation detection portion 16b.

The bias current generating portion 16a is disposed between the fluctuation detection portion 16b and the laser light generating portion 2. One end of the bias current generating portion 16a is connected to the laser light generating portion 2 via a node 6a, and the bias current generating portion 16a receives a control signal $I_2$ from the bias current control circuit 13a via the node 6b to thereby generate the bias current Ib. The fluctuation detection portion 16b is connected to the bias current generating portion 16a via a node 16c and detects changes in the bias current Ib. The fluctuation detection portion 16b may comprise resistance for detecting these changes. The voltage of the node 16c is provided to the V− terminal of the bias current control circuit 13a via the node 6c. Through this connection, the bias current control circuit 13a generates the control signal $I_2$ such that the control signal $V_2$ is generated at the node 16c.

A modulation current generating portion 18a is disposed between a fluctuation detection portion 18b and the laser light generating portion 2. The modulation current generating portion 18a is connected to the laser light generating portion 2 via the node 6a and receives a control signal $I_3$ from the modulation current control circuit 13b via the node 6e to generate a modulation current Im. The fluctuation detection portion 18b is also connected to the modulation current generating portion 18a via a node 18c and detects changes in the modulation current Im. The fluctuation detection portion 18b may also comprise resistance for detecting these changes. The voltage of the node 18c is provided to the V− terminal of the modulation current control circuit 13b via the node 6f. Through this connection, the modulation current control circuit 13b generates the control signal $I_3$ such that the control signal $V_3$ is generated at the node 18c.

The bias current Ib and modulation current Im are provided to the laser light generating portion 2. The modulation current Im is provided to the laser light generating portion 2 via the driving portion 20. The driving portion 20 comprises a differential pair portion 20a. The differential pair portion 20a is provided with first and second transistors 20b and 20c. One of the terminals (emitters) of each of the first and second transmitters 20b, 20c are connected to each other via a node 20d. The node 20d is connected to the modulation current control circuit portion 18. The other terminal 20e (collector) of the first transistor 20b is connected to the laser light generating portion 2 via the node 6a. The other terminal 20f (collector) of the second transistor 20c is connected to the mains via a node 6d. The control terminals (bases) 20g and 20h of the first and second transistors 20b and 20c are respectively connected to differential pair inputs 6g, 6h. A differential driving signal $V_{IN}$ is provided to the differential pair inputs 6g and 6h.

As an example of the constitution of the control means 12b, a central processing unit (CPU) 20 and memory 22 for storing programs and control data may be comprised. The memory 22 may comprise nonvolatile memory 22a and a circuit portion 22b for performing write operations to the nonvolatile memory 22a.

The interface portion 12e is connected via signal lines 28a, 28b to alarm units 26a, 26b which indicate the detection of abnormalities in the laser light generating portion 2.

The interface portion 12e is also connected to the control means 12b to transmit control signals to the control means 12b and to receive control signals from the control means 12b. The interface portion 12e is also capable of receiving signals for halting the generation of light in the laser light generating portion and of receiving signals for commencing the generation of light in the laser light generating portion. The interface portion 12e is also connected to an external control device 24, which is a computer, via a communication line 28c. When the interface portion 12e is used, characteristic data for a semiconductor laser element which are stored inside the external control device 24 can be loaded into the nonvolatile memory 22a by means of communication with the external control device 24. The characteristic data are calculated by the external control device 24. Further, by using the interface portion 12e to perform each individual adjustment operation necessary for the laser diode control circuit, the amount of adjustment time for these adjustments can be reduced in comparison with manual adjustment. In addition, when each individual piece of characteristic data for the semiconductor light source comprised in the laser light generating portion is stored in the external control device 24, which is a computer, adjustments reflecting each piece of individual characteristic data can be performed automatically.

Second Embodiment

Figure 2:
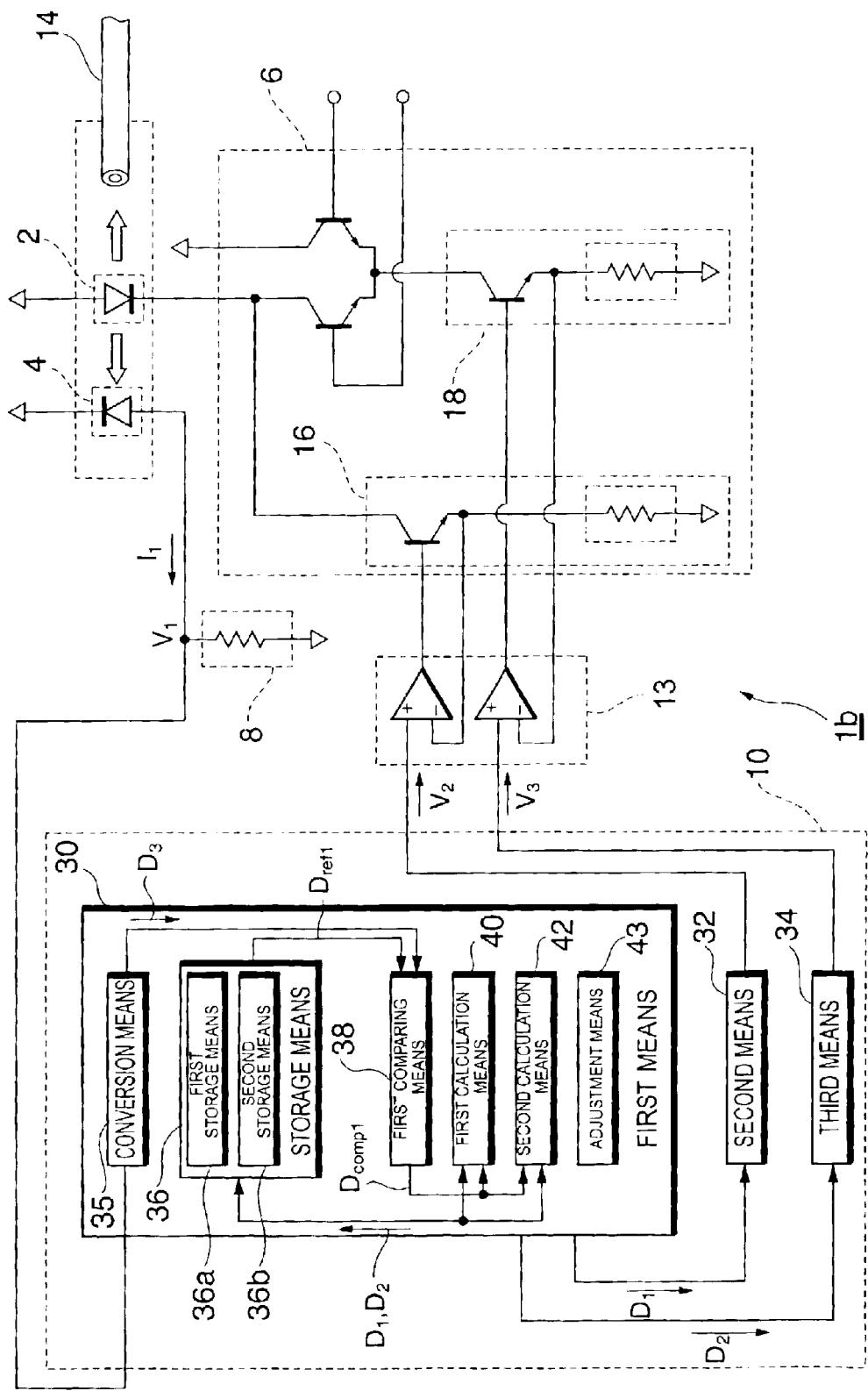
FIG. 2 is a block diagram illustrating a laser diode control circuit according to an embodiment of the present invention.

FIG. 2 is a block diagram showing a laser diode control circuit according to an embodiment of the present invention. A laser diode control circuit 1b comprises a driving circuit 6, a load portion 8, a control portion 10, and a bias current and modulation current control circuit 13. In FIG. 2, the control portion 10 is displayed as a functional block. In the laser diode control circuit 1b, the control portion 10 comprises first means 30, second means 32, and third means 34. The laser diode control circuit 1b may further comprise a laser light generating portion 2 and a monitoring photodetector 4, as in the first embodiment.

The first means 30 operate to produce an amount of change $\Delta Dm$ according to an amount of change $\Delta Db$ which is determined in accordance with the result of a comparison between a value corresponding to a monitor voltage $V_1$ which corresponds to a photocurrent $I_1$ and a reference value, and a function $f(Db, \Delta Db) = \Delta Dm$. The function f is defined such that the light emission power displays a predetermined dependence and the extinction ratio displays a predetermined dependence. A value Db, a value Dm, an amount of change $\Delta Db$ in respect of the value Db, and an amount of change $\Delta Dm$ in respect of the value Dm are all obtained by the first means 30. The second means 32 is constituted so as to receive a signal $D_1$ (for example, $Db+\Delta Db$) from the first means 30, and generates a first control signal $V_2$ from values corresponding to $\Delta Db$ and Db. The third means 34 is constituted so as to receive a signal $D_2$ (for example, $Dm+\Delta Dm$) from the first means 30, and generates a second control signal $V_3$ from values corresponding to $\Delta Dm$ and Dm.

The first means 30 comprises conversion means 35, storage means 36, first comparing means 38, first calculation means 40, and second calculation means 42. The conversion means 35 converts the voltage $V_1$ corresponding to the photocurrent value $I_1$ into a monitoring signal $D_3$. The storage means 36 comprises first storage means 36a and second storage means 36b. The first storage means 36a stores the value of $\Delta Dm/\Delta Db$ in relation to the range of the variable Ib. The data structure of the first storage means 36a will be explained later with reference to FIGS. 3A, 3B, 4A, and 4B. The second storage means 36b store the value Db corresponding to the current bias current Db and the value Dm corresponding to the current modulation current Dm. The first comparing means 38 receives and then compares the monitoring signal $D_3$ and a reference value $D_{ref1}$ from the storage means 36, and provides a comparison signal $D_{comp1}$. The first calculation means 40 receives the comparison signal $D_{comp1}$ from the first comparing means 38, and if the comparison signal $D_{comp1}$ indicates that the monitoring signal $D_3$ is smaller than the reference value $D_{ref1}$ (if the photocurrent is smaller than a predetermined value), determines the value $\Delta Dm$ on the basis of a positive value (a value set so as to increase the bias current) of $\Delta Db$ and the storage content of the first storage means 36a. The second calculation means 42 receives the comparison signal $D_{comp1}$ from the first comparing means 38, and if the comparison signal $D_{comp1}$ indicates that the monitoring signal $D_3$ is larger than the reference value $D_{ref1}$ (if the photocurrent is larger than a predetermined value), determines the value $\Delta Dm$ on the basis of a negative value (a value set so as to decrease the modulation current) of $\Delta Db$ and the storage content of the first storage means 36a. The signal $D_1$ and the signal $D_2$ which are provided to the second and third means 32, 34 are provided by the first calculation means 40 or second calculation means 42.

The first calculation means 40 and second calculation means 42 also generate the signal $D_1$ (for example, $Db+\Delta Db$) and the signal $D_2$ (for example, $Dm+\Delta Dm$) from the calculated $\Delta Dm$ and Db, and $\Delta Db$ and Dm and then provide these signals to the second storage means 36b. The second storage means 36b stores $(Db+\Delta Db)$ as updated Db on a predetermined storage element and stores $(Dm+\Delta Dm)$ as updated Dm on a predetermined storage element.

Figure 3A:
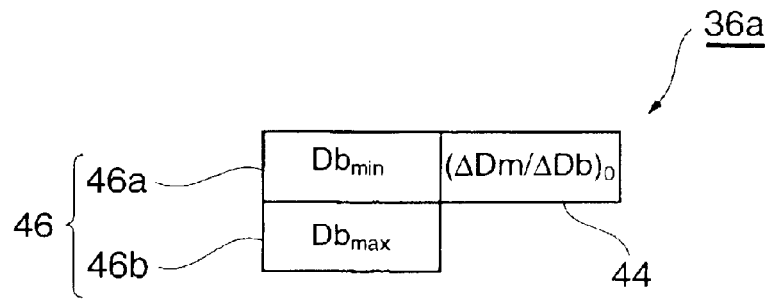
FIG. 3A is a view showing a data structure in first storage means.
Figure 3B:
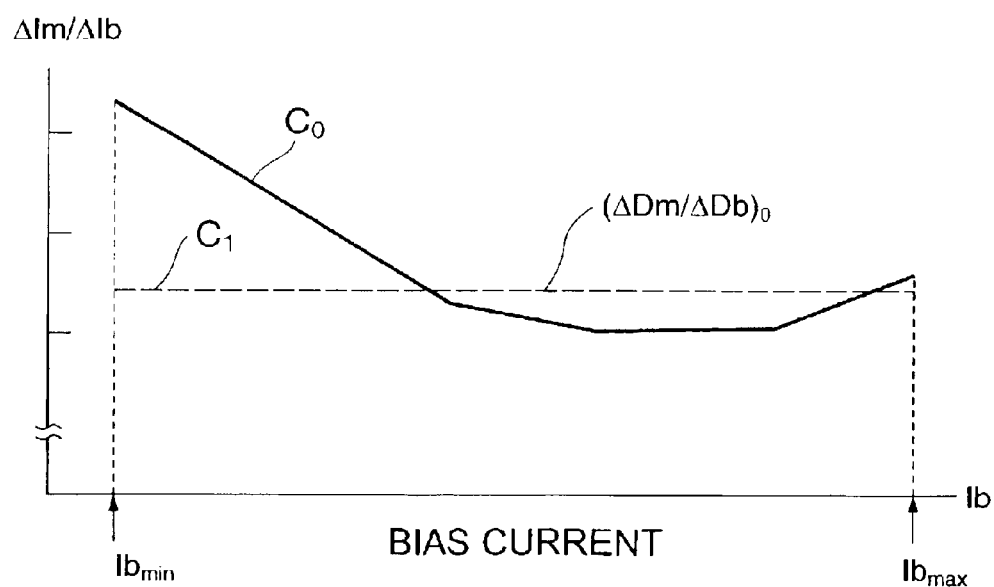
FIG. 3B is a graph showing a characteristic line $C_0$ which is defined such that the light emission power is constant and the extinction ratio is constant, and an approximation line $C_1$ for the data of the data structure shown in FIG. 3A.

FIG. 3A is a view showing the data structure of the first storage means 36a. The first storage means 36a comprises a storage element 44 for storing a constant value $(\Delta Dm/\Delta Db)_0$ $((\Delta Im/\Delta Ib)_0)$ in a predetermined bias current range. The first storage means 36a also comprises storage elements 46a, 46b for storing values $Db_{min}$ ($Ib_{min}$) and $Db_{max}$ ($Ib_{max}$) indicating the range in which $(\Delta Dm/\Delta Db)_0$ $((\Delta Im/\Delta Ib)_0)$ can be used. FIG. 3B is a graph showing a characteristic line $C_0$ defined such that the light emission power is constant and the extinction ratio is constant, and an approximation line $C_1$ for data having the data structure shown in FIG. 3A. The abscissa of the graph shows the bias current Ib, and the ordinate shows $(\Delta Im/\Delta Ib)$.

The first means 30 generates $(\Delta Dm/\Delta Db)_0 \Delta Db = \Delta Dm$ from $\Delta Db$ determined on the basis of the monitor value $D_3$ and from data $(\Delta Dm/\Delta Db)_0$. The function f illustrated in FIG. 3B is simple, and thus realization thereof is easy. It is also possible to control the light emission power and extinction ratio toward constant values in the range of the predetermined bias current or modulation current. Further, the circuit scale can be reduced and the number of steps in the processing program can be decreased.

Figure 4A:
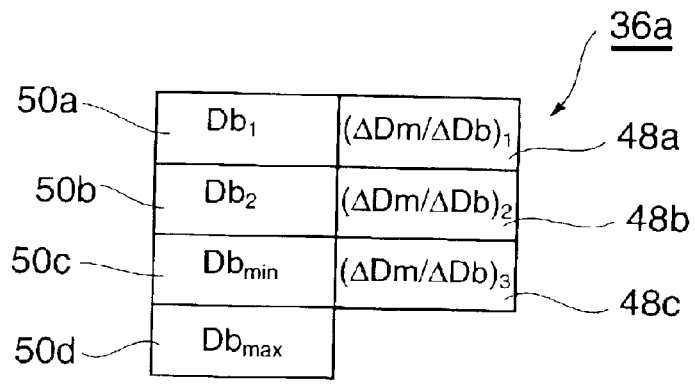
FIG. 4A is a view showing a data structure in the first storage means.
Figure 4B:
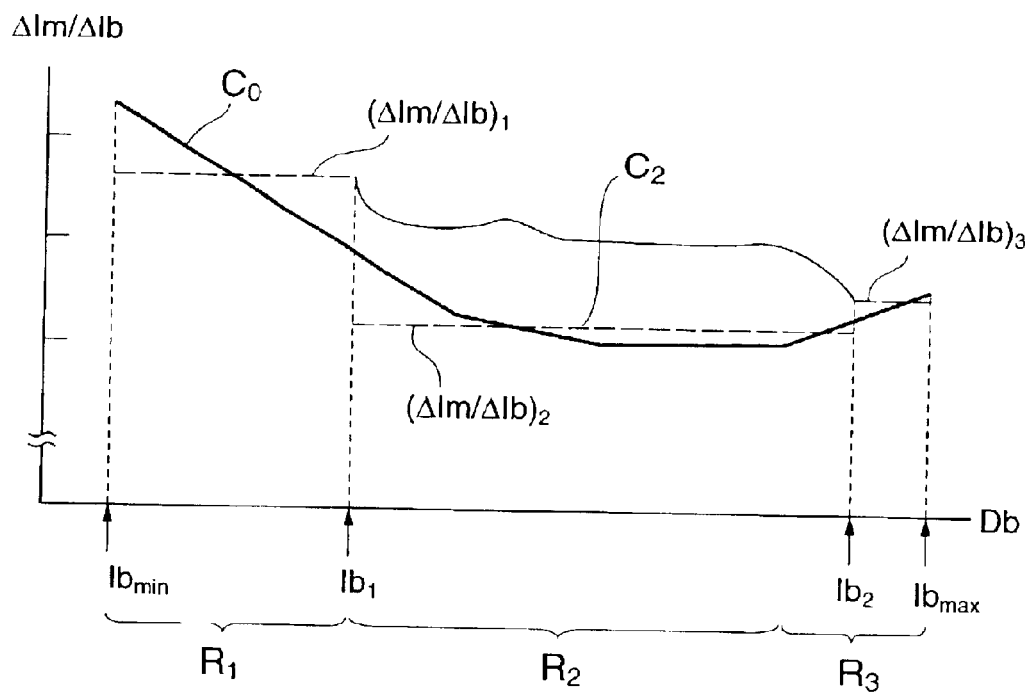
FIG. 4B is a graph showing the characteristic line $C_0$ which is defined such that the light emission power is constant and the extinction ratio is constant, and an approximation line $C_2$ for the data of the data structure shown in FIG. 4A.

FIG. 4A is a view showing the data structure of the first storage means 36a. The data shown in FIG. 4A express another approximated function. In this embodiment, the first storage means 36a comprises storage elements 50a, 50b for storing boundary values $Db_1$ ($Ib_1$) and $Db_2$ ($Ib_2$) to divide the bias current Db (Ib) range. The first storage means 36a also comprises storage elements 50c, 50d for storing values $Db_{min}$ ($Ib_{min}$) and $Db_{max}$ which define the upper limit and lower limit of the bias current region. The entire range between the upper limit and the lower limit of the bias current is divided into a plurality of regions ($R_n$: $n \geq 1$) by the boundary values, and the first storage means 36a is constituted so as to store a constant $(\Delta Im/\Delta Ib)_n$ corresponding to each of the plurality of regions $R_n$. In this embodiment, the first storage means 36a comprises storage elements 48a, 48b, 48c for storing the value of the constant $(\Delta Dm/\Delta Db)_1$ $((\Delta Im/\Delta Ib)_1)$, a value $(\Delta Dm/\Delta Db)_2$ $((\Delta Im/\Delta Ib)_2)$, and a value $(\Delta Dm/\Delta Db)_3$ $((\Delta Im/\Delta Ib)_3)$, which are defined for each of three regions $R_1$, $R_2$, $R_3$. FIG. 4B is a graph showing a characteristic line $C_0$ defined such that the light emission power is constant and the extinction ratio is constant, and an approximation line $C_2$ for data having the data structure shown in FIG. 4A. The abscissa of the graph shows the bias current Ib, and the ordinate shows $(\Delta Im/\Delta Ib)$.

The first means 30 determines $(\Delta Dm/\Delta Db)_i \Delta Db = \Delta Dm$ from $\Delta Db$ determined by the monitoring signal $D_3$ and from data $(\Delta Dm/\Delta Db)_i$ (i=1,2,3). The function f illustrated in FIG. 4B is comparatively simple, and thus realization thereof is comparatively easy. Although this approximation is easy, it is possible to control the light emission power and extinction ratio toward constant values in the predetermined bias current or modulation current range.

Also in the laser diode control circuit $1b$, the control portion 10 may be provided with adjustment means 43 for providing a value of $\Delta Db$ which differs according to the value of the variable Db. According to the adjustment means, the speed of response to photocurrent fluctuation may be modified according to the bias current or modulation current range. Also, if $\Delta Ib$ is modified in a temperature region in which the rate of change of the bias current Ib in respect of temperature is large, the convergence of Ib and Im can be accelerated.

Third Embodiment

Figure 5A:
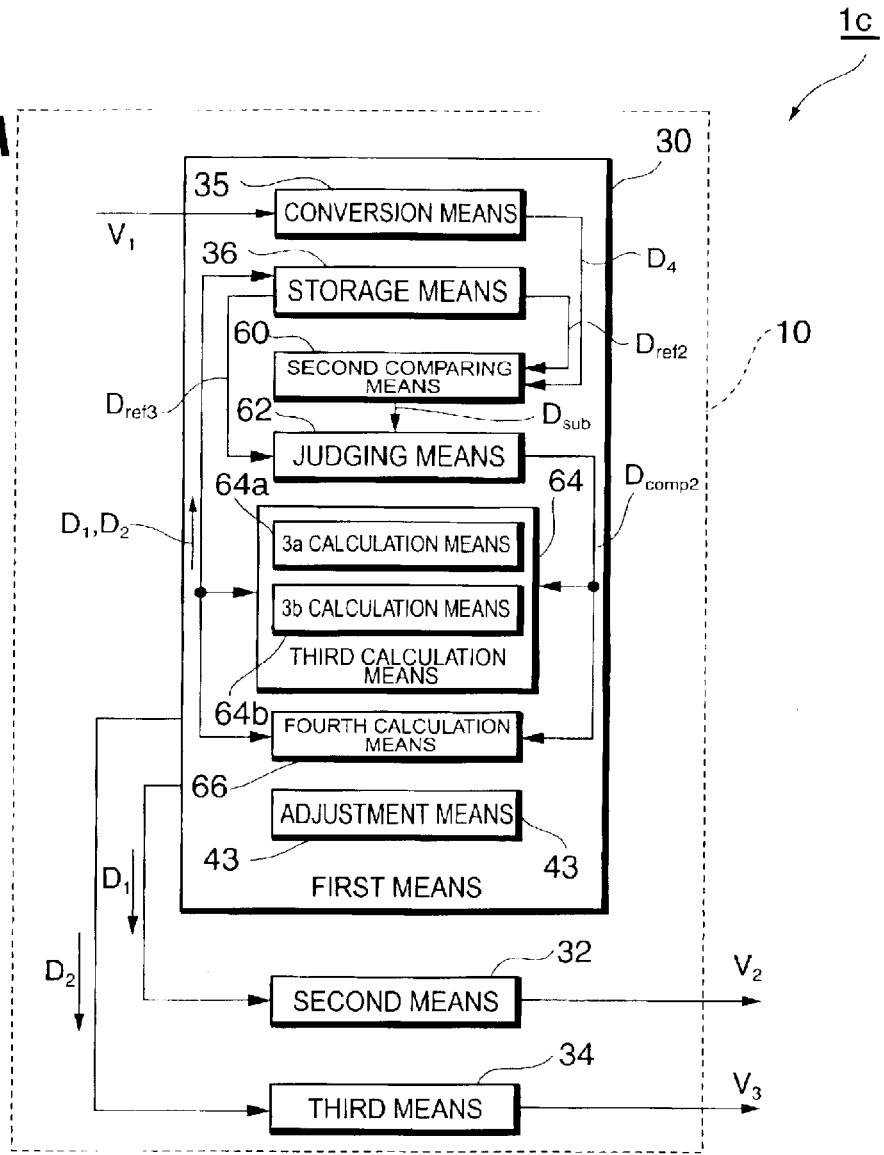
FIG. 5A is a block diagram illustrating a laser diode control circuit according to an embodiment of the present invention.

FIG. 5A is a block diagram showing a laser diode control circuit according to an embodiment of the present invention. The control portion 10 of the laser diode control circuit $1c$ comprises first to third means 30, 32, 34. The first means 30 is constituted by conversion means 35, storage means 36, second comparing means 60, judging means 62, third calculation means 64, and fourth calculation means 66. The first storage means 36a stores the value of $\Delta Dm/\Delta Db$ in relation to the range of the variable Db. The second comparing means 60 receives and then compares a reference value $D_{ref2}$ and a monitoring signal $D_4$ from the second storage means 36b, and provides a comparison signal $D_{sub}$. The judging means 62 judges which of the absolute value of the comparison signal $D_{sub}$ and a predetermined value $D_{ref3}$ is larger and thereby produces a judgment result $D_{comp2}$. The judgment result $D_{comp2}$ is generated by subtracting one of the comparison result $D_{sub}$ and the predetermined value $D_{ref3}$ from the other of the comparison result $D_{sub}$ and the predetermined value $D_{ref3}$.

The third calculation means 64 comprises 3a calculation means 64a and 3b calculation means 64b. The third calculation means 64 operates when the judgment result $D_{comp2}$ from the judgment means 62 is zero or greater (when it is judged that the absolute change quantity of the photocurrent is significant). If this condition is satisfied, the 3a calculation means 64a generates a value $\Delta Dm$ on the basis of a positive value (a value set such that the bias current increases) of $\Delta Db$ and the storage content (function f) of the storage means 36 when the monitoring signal $D_4$ is smaller than the reference value $D_{ref2}$ (when the photocurrent is smaller than a predetermined value). Also if this condition is satisfied, the 3b calculation means 64b operate to generate a value $\Delta Dm$ on the basis of a negative value (a value set such that the bias current decreases) of $\Delta Db$ and the storage content (function f) of the storage means 36 when the monitoring signal $D_4$ is larger than the reference value $D_{ref2}$ (when the photocurrent is larger than a predetermined value).

If the absolute value of the difference between the monitoring signal $D_4$ and the reference value $D_{ref2}$ is less than the predetermined value $D_{ref3}$ (if it is judged that the absolute change quantity of the photocurrent is not significant), the fourth calculation means 66 operates to maintain the value Db and the value Dm. This is realized, for example, by setting $\Delta Db=\Delta Dm=0$ in the control portion 10 without updating $\Delta Dm$ using $\Delta Db$ and the function f. However this is not limited thereto.

According to the constitution of this embodiment, control of the bias current and modulation current may be modified in accordance with the absolute value of the difference between the monitoring signal and reference value, and thus the bias current and modulation current can be prevented from fluctuating minutely.

The second means 32 generates the first control signal $V_2$ from a value corresponding to $\Delta Db$ and Db. The third means 34 generates the second control signal $V_3$ from a value corresponding to $\Delta Dm$ and Dm.

Figure 5B:
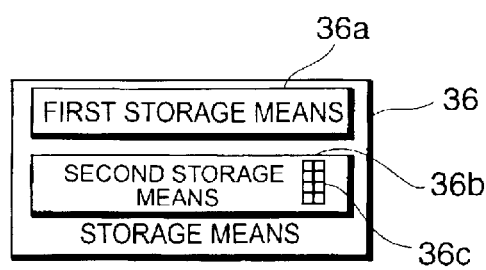
FIG. 5B is a block diagram illustrating the constitution of storage means.

FIG. 5B is a block diagram showing the constitution of the storage means 36. The first storage means 36a may have a data structure as that explained previously with reference to FIGS. 3A, 3B, 4A, and 4B. The second storage means 36b comprises a storage element 36c for storing a value Db corresponding to the current bias current Ib, a value Dm corresponding to the current modulation current Im, the reference value $D_{ref2}$, the predetermined value $D_{ref3}$, and other data.

Fourth Embodiment

Figure 6:
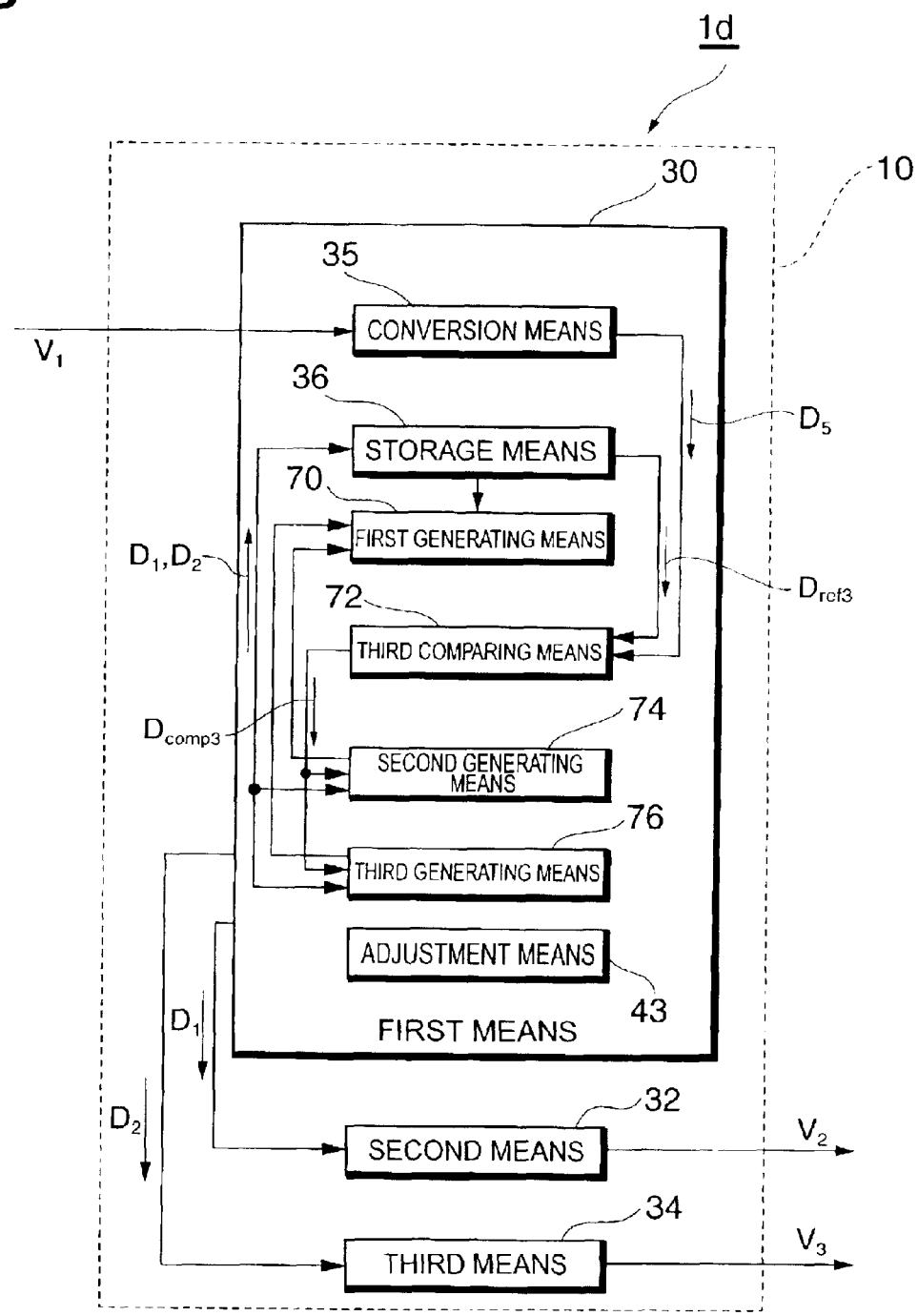
FIG. 6 is a block diagram illustrating a laser diode control circuit according to an embodiment of the present invention.

FIG. 6 is a block diagram of a laser diode control circuit according to an embodiment of the present invention. The control portion 10 of the laser diode control circuit $1d$ comprises conversion means 35, storage means 36, first generating means 70, third comparing means 72, second generating means 74, and third generating means 76.

The first generating means 70 generates a value $(\Delta Y/\Delta X)_m$ defined by a linear function in respect of X in an arbitrary region $R_m$ from among a plurality of regions ($R_m$: m≧1) into which the entire range of the variable Db is divided. In order to realize this function, the storage means 36 has the following data structure.

Figure 7A:
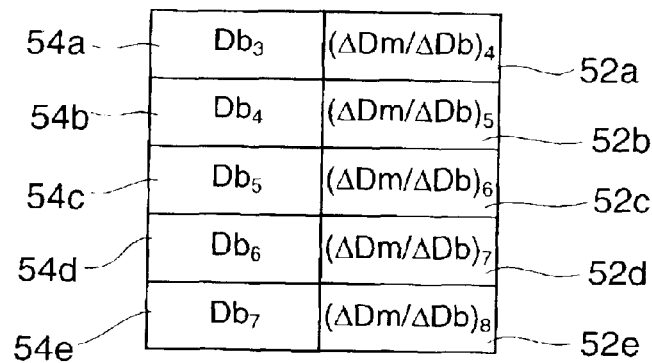

FIG. 7A is a view illustrating the data structure of the first storage means 36a. The first storage means 36a stores a plurality of bias current values and values $(\Delta Im/\Delta Ib)_n$ corresponding to these values. In this embodiment, the first storage means 36a comprises storage elements 52a, 52b, 52c, 52d, 52e for storing the plurality of bias current values $Db_3$ to $Db_7$ ($Ib_3$ to $Ib_7$), and also comprises storage elements 54a, 54b, 54c, 54d, 54e for storing values $(\Delta Dm/\Delta Db)_3$ to $(\Delta Dm/\Delta Db)_7$ (($\Delta Im/\Delta Ib)_3$ to ($\Delta Im/\Delta Ib)_7$) in relation to each of the storage elements 52a, 52b, 52c, 52d, 52e.

Figure 7B:
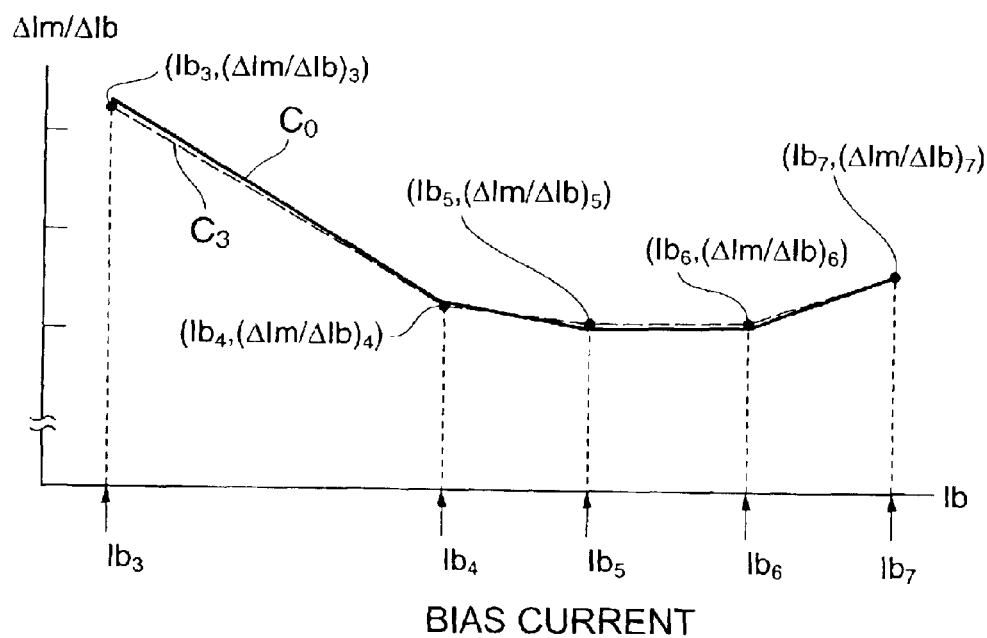
FIG. 7B is a graph showing the characteristic line $C_0$ which is defined such that the light emission power is constant and the extinction ratio is constant, and an approximation line (broken line) $C_3$ for data of the data structure shown in FIG. 7A.

FIG. 7B is a graph showing a characteristic line $C_0$ defined such that the light emission power is constant and the extinction ratio is constant, and an approximation line (broken line) $C_3$ for data within the data structure shown in FIG. 7A. The abscissa of the graph shows the bias current Ib, and the ordinate shows $(\Delta Im/\Delta Ib)$.

Referring to FIG. 6, the first generating means 70 uses the data shown in FIG. 7A to generate a value of the linear function f of the independent variable Db for each region of Db. In this embodiment, the function f is expressed as a straight line which passes through two adjacent points stored inside the first storage means 36a. The function f obtained in this manner becomes an approximated function in respect of the characteristic line $C_0$ in the region between the two adjacent points.

The third comparing means 72 receives and then compares a monitoring signal $D_5$ and a reference value $D_{ref3}$ from the storage means 36, and provides a comparison signal $D_{comp3}$. The second generating means 74 is constituted so as to receive the comparison signal $D_{comp3}$ from the third comparing means 72, and when the comparison signal $D_{comp3}$ indicates that the monitoring signal $D_5$ is smaller than the reference value $D_{ref3}$ (when the photocurrent is smaller than a predetermined value), the second generating means 74 determines the value $\Delta Dm$ on the basis of the value $(\Delta Y/\Delta X)_m$ provided by the first generating means 70, a positive value (a value set such that the bias current increases) of ΔDb, and the function f. The third generating means 76 is constituted to receive the comparison signal $D_{comp3}$, and when the comparison signal $D_{comp3}$ indicates that the monitoring signal $D_5$ is larger than the reference value $D_{ref3}$ (when the photocurrent is larger than a predetermined value), the third generating means 76 determines the value ΔDm on the basis of the value $(\Delta Y/\Delta X)_m$ provided by the first generating means 70, a negative value (a value set such that the bias current decreases) of ΔDb, and the function f. The signal $D_1$ (for example, Db+ΔDb) and the signal $D_2$ (for example Dm+ΔDm) which are provided to the second and third means 32, 34 are obtained by the second generating means 74 or third generating means 76.

The constitution of this control portion can be realized comparatively easily. Further, in comparison to control by the function f described in the second embodiment, control such that the light emission power and extinction ratio come close to a constant value may be performed with even greater precision in a relatively wide bias current, modulation current, and temperature range.

Fifth Embodiment

Figure 8:
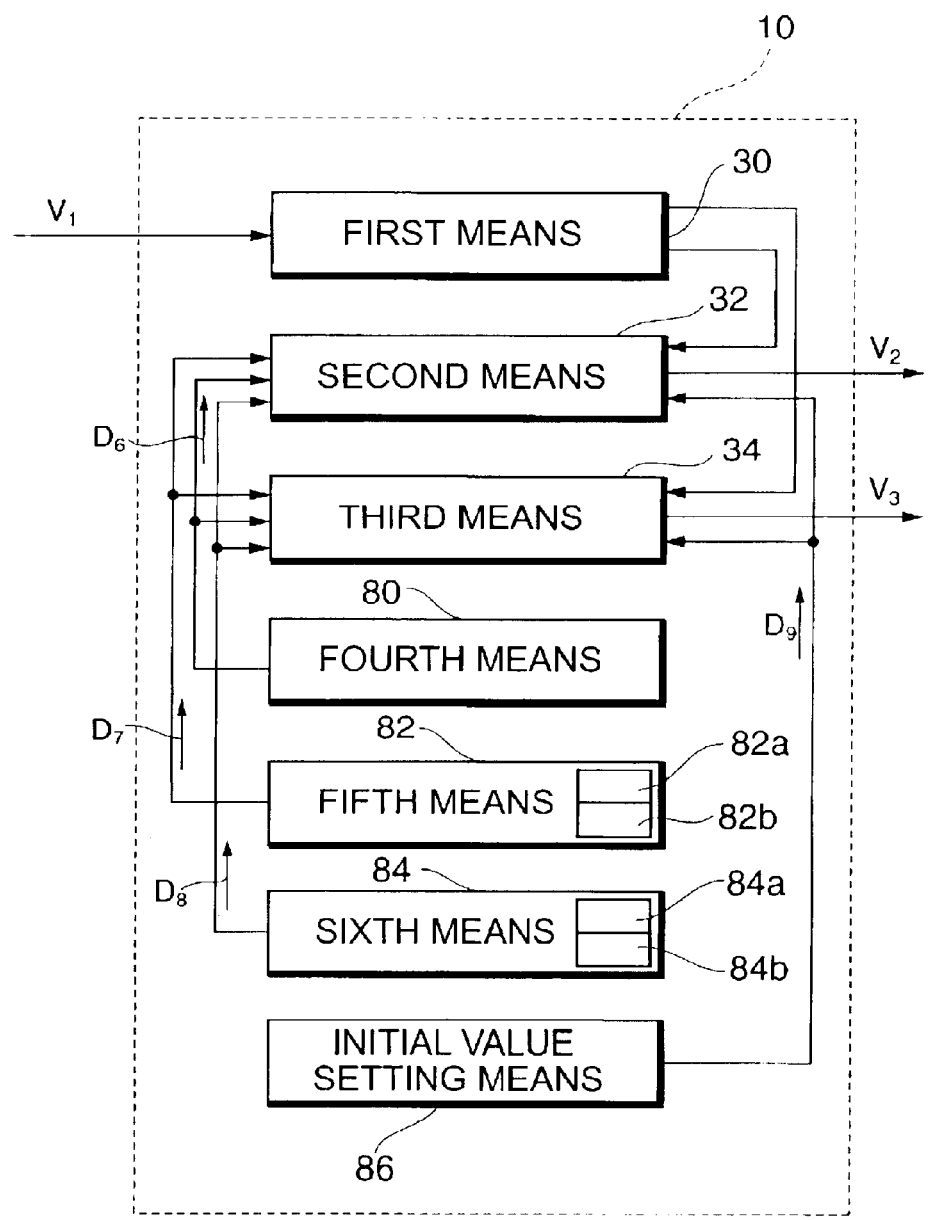
FIG. 8 is a block diagram illustrating a laser diode control circuit according to an embodiment of the present invention.

FIG. 8 is a block diagram showing a laser diode control circuit according to an embodiment of the present invention. The control portion 10 of the laser diode control circuit 1e comprises first means 30, second means 32, third means 34, fourth means 80, fifth means 82, sixth means 84, and initial value setting means 86.

When the difference between the monitoring signal value $D_6$ corresponding to the voltage $V_1$ which corresponds to the photocurrent $I_1$ and a reference value $D_{ref4}$ is less than a threshold $D_{th1}$, the fourth means 80 generate a control signal $D_6$ such that the bias current and modulation current are not updated. The control signal $D_6$ at this time is a signal for realizing ΔIb=0 and ΔIm=0, for example, although not limited thereto. According to this constitution, minute fluctuation in the bias current and modulation current can be prevented. The second and third means generate the first and second control signals $V_1$, $V_2$ in response to this control signal $D_6$.

When either the value Db exceeds a bias current threshold $D_{th2}$ (when the bias current exceeds a predetermined value) or the value Dm exceeds a modulation current threshold $D_{th3}$ (when the modulation current exceeds a predetermined value), the fifth means 82 generates a control signal $D_7$ such that the bias current and modulation current are not increased. The second and third means generate the first and second control signals $V_1$, $V_2$ in response to this control signal $D_7$. According to this constitution, excess bias current and modulation current are detected so that an overcurrent can be prevented from being supplied to the driving circuit.

In order to realize this function, the fifth means 82 comprises means 82a for detecting the occurrence of either the value Db exceeding the bias current threshold $D_{th2}$ (the bias current exceeding a predetermined value) or the value Dm exceeding the modulation current threshold $D_{th3}$ (the modulation current exceeding a predetermined value), and means 82b for generating in response to this detection the control signal $D_7$ for generating ΔDb=ΔDm=0, for example. Note that the fifth means 82 may be used in the initial value setting of the laser diode control circuit.

By using the fifth means 82, even when the usage environment of the semiconductor laser element temporarily moves outside of the defined range, control to hold the light emission power and extinction ratio at a constant level may be begun following the return of the usage environment to within the defined range. Moreover, overcurrent production can be prevented during activation of the laser diode or when the laser module breaks down.

When either the value Db is less than a bias current threshold $D_{th4}$ (when the bias current is less than a predetermined value) or the value Dm is less than a modulation current threshold $D_{th5}$ (when the modulation current is less than a predetermined value), the sixth means 84 generates a control signal $D_8$ such that the bias current and modulation current are not decreased. The second and third means generate the first and second control signals $V_1$, $V_2$ in response to this control signal $D_8$. According to this constitution, reductions in the optical output from the laser light generating portion are detected.

In order to realize this function, the sixth means 84 further comprises means 84a for detecting the occurrence of either the value Db falling below the bias current threshold $D_{th4}$ or the value Dm falling below the modulation current threshold $D_{th5}$, and means 84b for generating in response to this detection ΔDb=ΔDm=0, for example. Note that the sixth means 84 may be used in the initial value setting of the laser diode control circuit.

By using the sixth means 84, even when the usage environment of the semiconductor laser element temporarily moves outside of the defined range, control to hold the light emission power and extinction ratio at a constant level may be begun following the return of the usage environment to within the defined range.

The initial value setting means 86 is provided with a set of a plurality of control signals (first control signal, second control signal)$_i$ (i=1 ... n) in succession to generate a control signal $D_9$ for activating the laser diode control circuit 1e. The second and third means generate the first and second control signals $V_1$, $V_2$ in response to this control signal $D_9$. According to this constitution, an overcurrent is prevented from flowing excessively into the laser light generating portion 2 when the laser light generating portion 2 begins to operate.

The initial value setting means is not limited to the above constitution. When the semiconductor laser element is activated, the bias current and modulation current are set according to the following procedure. First, setting of a reference point at which the bias current Ib is at a minimum (first control signal, second control signal)$_a$ is performed. After a predetermined amount of time (the time from the supply of power to the attainment of stable light emission), the value $D_4$ corresponding to the photocurrent from the monitoring photodetector is compared to a target value. If the value $D_4$ is smaller than the target value (if the optical power of the light is smaller than the target optical power of the light), a reference point (first control signal, second control signal)$_b$ is set. Thereafter, prepared reference points are provided in succession. Through repetition thereof, when either the value $D_4$ corresponding to the photocurrent from the monitoring photodetector exceeds the target value or when setting of the reference points is complete (when the optical power of the light is within a predetermined value from the target optical power of the light), the initial value setting routine ends and processing returns to the normal control procedure.

The constants in this embodiment and the other embodiments, such as the reference value $D_{ref4}$, the threshold $D_{th1}$, the bias current threshold $D_{th2}$, the modulation current threshold $D_{th3}$, the less-than bias current threshold $D_{th4}$, the modulation current threshold $D_{th5}$, the set of the plurality of control signals (first control signal, second control signal)$_i$ (i=1 ... n), and the plurality of reference points (first control signal, second control signal)$_j$ (j=a,b,c . . . ) may be stored in the storage element 36c inside the second storage means 36b.

Sixth Embodiment

Figure 9:
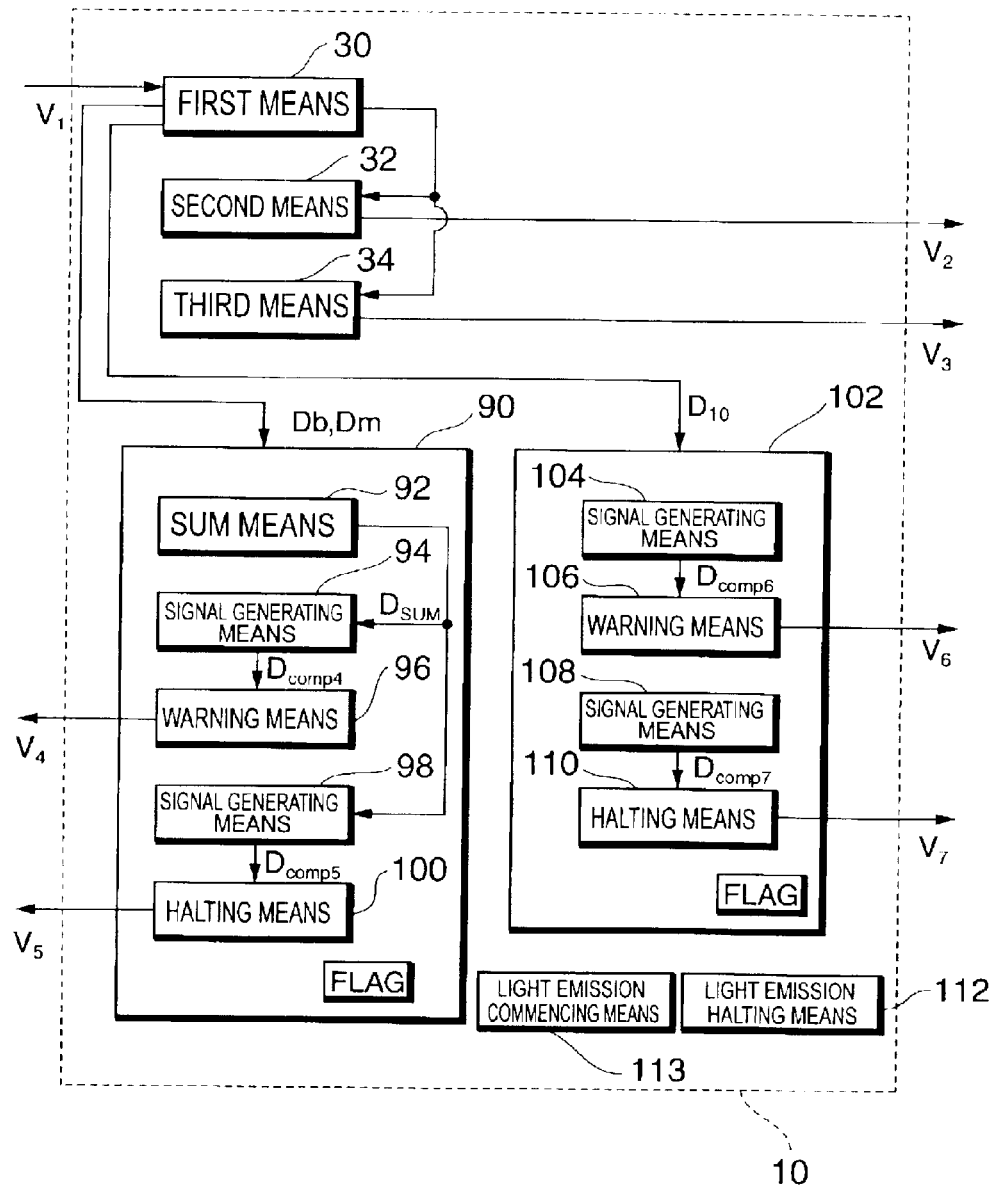
FIG. 9 is a block diagram illustrating a laser diode control circuit according to an embodiment of the present invention.

FIG. 9 is a block diagram of a laser diode control circuit according to an embodiment of the present invention. The control portion 10 of the laser diode control circuit 1f comprises first means 30, second means 32, and third means 34. The control portion 10 may be further provided with excessive current detection means 90 for detecting current excess in the laser light generating portion. According to this means 90, breakdowns and deterioration of the laser light generating portion can be detected. The control portion 10 may further comprise power decrease detection means 102 for detecting power decreases in the laser light generating portion. According to this means 102, breakdowns and deterioration of the laser light generating portion can be detected.

By using both the excessive current detection means 90 and the power decrease detection means 102, a state in which the laser light generating portion emits light at a predetermined optical output power but the power supply is excessively large (deterioration) can be differentiated from a state in which the laser light generating portion does not emit light (breakdown). Thus, by detecting the deterioration of the laser light generating portion and replacing the optical module, unforeseen breakdowns of the system can be avoided.

The excessive current detection means 90 comprises means 92 for producing the sum $D_{sum}$ of Db and Dm, means 94 for generating a comparison signal $D_{comp4}$ when the sum $D_{sum}$ equals or exceeds a threshold $D_{th6}$, and means 96 for generating a first alarm signal $V_4$ indicating excessive current in the laser light generating portion 2 in response to the comparison signal $D_{comp4}$. According to this constitution, excessive current in the laser light generating portion 2 can be detected. The detection portion 90 is also provided with a storage element for storing a flag which is set when the first alarm signal $V_4$ is generated, and further comprises means 98 for generating a comparison signal $D_{comp5}$ when this flag is set and the sum $D_{sum}$ is below a threshold $D_{th7}$, and means 100 for generating a first halting signal $V_5$ for halting the first alarm signal $V_4$ in response to the comparison signal $D_{comp5}$. According to this constitution, the alarm concerning a detected overcurrent can be stopped. This comparison may be conducted using Dm, Db instead of $D_{sum}$. If the threshold $D_{th7}$ in the excessive current detection means 90 is determined so as to have hysteresis in respect of the threshold $D_{th6}$, the alarm output can be prevented from wavering.

The power decrease detection means 102 comprises means for generating a comparison signal $D_{comp6}$ indicating that a monitoring signal $D_{10}$ which corresponds to the photocurrent is at or below a threshold $D_{th8}$, and means for generating a second alarm signal $V_6$ in response to the comparison signal $D_{comp6}$ which indicates a decrease in the light emission power of the laser light generating portion 2. According to this constitution, decreases in the light emission power of the laser light generating portion can be detected. The power decrease detection portion 102 is also provided with a storage element for storing a flag which is set when the second alarm signal $V_6$ is generated, and further comprises means for generating a comparison signal $D_{comp7}$ when this flag is set and the monitoring signal $D_{10}$ is equal to or greater than a threshold $D_{th9}$, and means for halting the second alarm signal in response to the comparison signal $D_{comp7}$. According to this constitution, the alarm concerning a detected power decrease can be stopped. If the threshold $D_{th7}$ in the power decrease detection means 102 is determined so as to have hysteresis in respect of the threshold $D_{th6}$, the alarm output can be prevented from chattering.

Light emission halting means 112 operates to halt the generation of light in the laser light generating portion in response to a signal from the interface portion. Light emission commencing means 113 operates to commence light generation in the laser light generating portion in response to a signal from the interface portion. By providing these means, the optical output can be halted when disconnection of an optical connector which is connected to the laser diode control circuit is detected. As a result, defects caused by the leakage of laser light can be prevented. Further, by intentionally switching the optical output from the laser light generating portion on and off, transmission in an optical fiber to which the laser light generating portion is optically coupled can be ensured.

Seventh Embodiment

In the laser diode control circuit described in the aforementioned embodiments, the bias current and modulation current are controlled on the basis of signals from the laser light generating portion. According to this circuit, not only can control be performed using the function f such that the light emission power is brought close to a constant value, but control can also be performed using the function f such that the extinction ratio is brought close to a constant value.

The reason why control such that the light emission power and extinction ratio are brought close to a constant value is possible according to the laser diode control circuit described in the aforementioned embodiments will now be explained.

Figure 10:
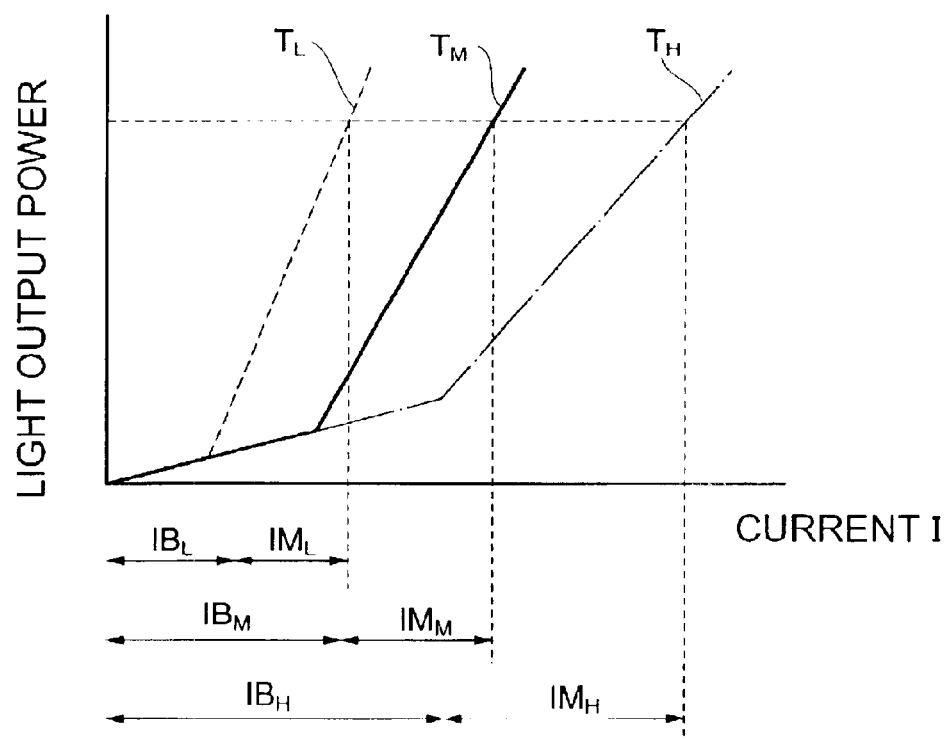
FIG. 10 is an I-L characteristic view of a semiconductor laser element.

FIG. 10 illustrates the I-L characteristic of a semiconductor laser element. The abscissa shows the driving current and the ordinate shows the optical output power. In FIG. 10, the symbol $T_M$ indicates an I-L characteristic line at normal temperature (25° C. for example), the symbol $T_L$ indicates an I-L characteristic line at a low temperature (<25° C. for example), and the symbol $T_H$ indicates an I-L characteristic line at a high temperature (>25° C. for example). According to this characteristic diagram, it is necessary to increase the driving current in line with increases in temperature in order to obtain a constant light emission power. The driving current is constituted by the bias current and the modulation current. The proportion of bias current to modulation current differs according to each temperature. However, when the laser driving current is controlled by being divided into bias current and modulation current, not only the optical output power but also the extinction ratio can be controlled. Further, the threshold current $I_{th}$ of the laser diode fluctuates according to each individual semiconductor laser element, but by using the methods described in the aforementioned embodiments, adjustment of this fluctuation may be implemented for each individual semiconductor laser element.

Figure 11:
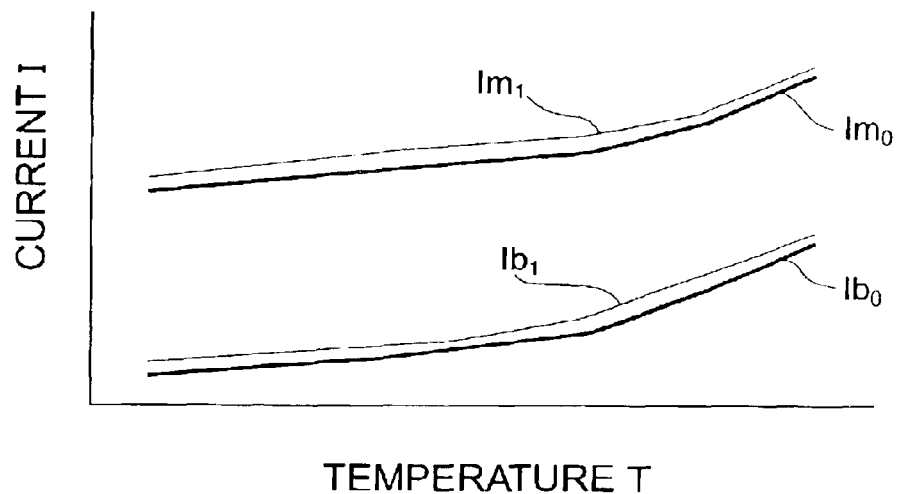
FIG. 11 is a view showing the temperature dependence of a bias current and a modulation current measured while adjusting the light emission power and extinction ratio of a semiconductor laser element to constant levels.

The inventors defined $I_{th}+I\alpha$ (where $I_{th}$ is the threshold current) as the bias current Ib, and defined the modulation current as the difference between the laser driving current and the bias current. The inventors then measured the temperature dependence of the bias current and modulation current of a semiconductor laser element. FIG. 11 is a view showing the temperature dependence of the bias current and modulation current which was measured while adjusting the light emission power and extinction ratio of a semiconductor laser element to constant levels. The ordinate shows current and the abscissa shows temperature. In FIG. 11, the symbols $Im_0$ and $Ib_0$ indicate the initial current characteristics of the semiconductor laser element.

The inventors also measured the temperature dependence of the bias current and modulation current of a semiconductor laser element having an altered characteristic due to long-term use (deterioration over time) under similar conditions. In FIG. 11, the symbols $Im_1$ and $Ib_1$ indicate the current characteristics of this semiconductor laser element. The inventors compared the characteristic curved lines $Im_0$ and $Ib_0$ with the characteristic curved lines $Im_1$ and $Ib_1$. According to the results of this comparison, it was learned that by shifting the characteristic curved lines $Im_0$ and $Ib_0$ to the left (the low temperature region), an approximation of the characteristic curved lines $Im_1$ and $Ib_1$ is obtained. This shift indicates that unless the bias current and modulation current in the semiconductor laser element with a deteriorated characteristic is increased, the light emission power and extinction ratio cannot be held at a constant level.

Figure 12:
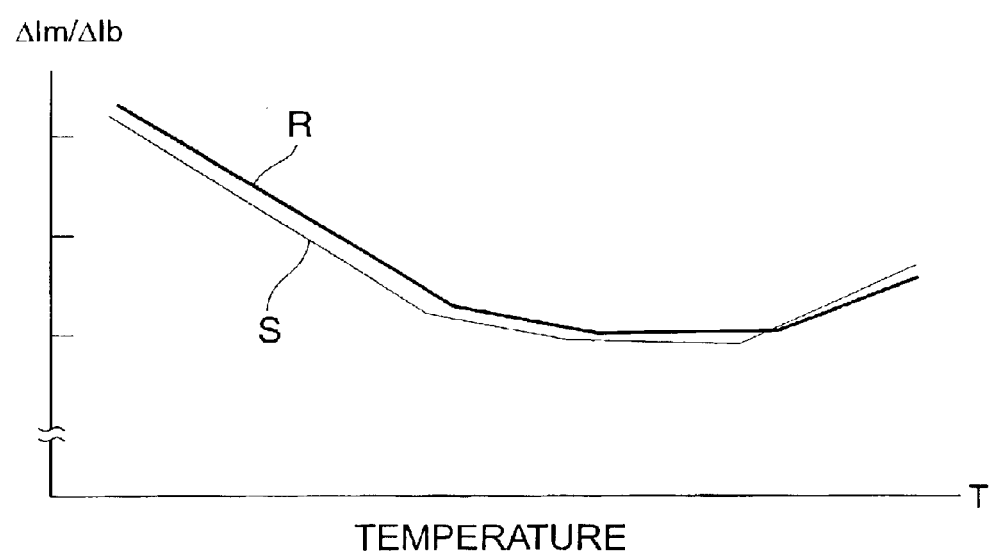
FIG. 12 is a characteristic view showing the temperature dependence of (ΔIm/ΔIb)

FIG. 12 is a characteristic view of the temperature dependence of ($\Delta Im/\Delta Ib$). This characteristic view may be obtained from the characteristic curved lines in FIG. 11. The characteristic curved line R in FIG. 12 is obtained by determining differential coefficients ($\Delta Im/\Delta T$) and ($\Delta Ib/\Delta T$) in relation to the temperature of the modulation current characteristic curved line Im and the bias current characteristic curved line Ib at each of the temperatures shown in FIG. 11, and then calculating and plotting the ratio thereof ($\Delta Im/\Delta Ib$). Differential coefficients for the characteristic curved lines $Im_1$ and $Ib_1$ of the semiconductor laser element which has deteriorated with time may also be calculated. It was learned from the results thereof that the characteristic curved line R can be expressed approximately by a curved line S which is shifted to the left (the low temperature region) of the characteristic curved line R.

Figure 13:
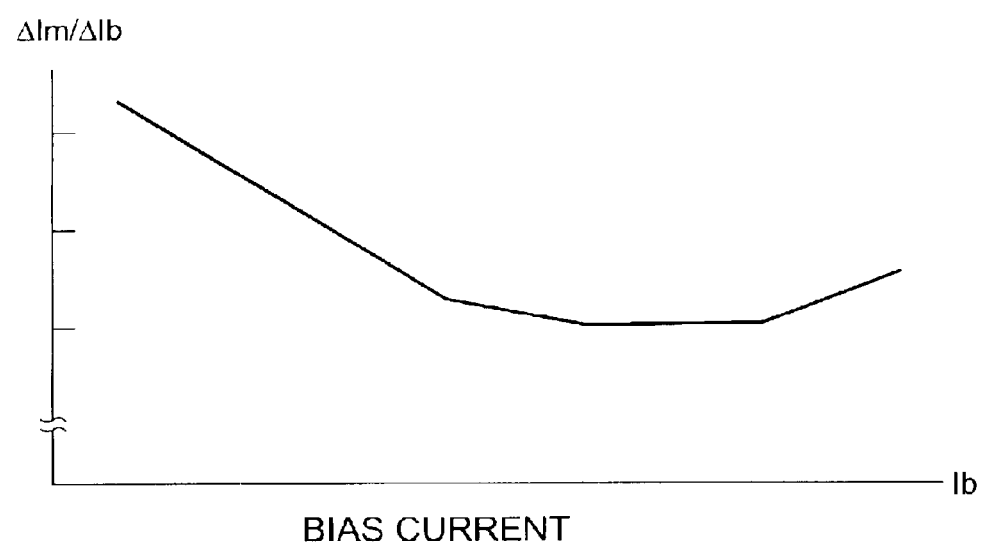
FIG. 13 is a characteristic view showing the bias current Ib dependence of (ΔIm/ΔIb)

FIG. 13 is a characteristic view illustrating the bias current Ib dependence of ($\Delta Im/\Delta Ib$). The abscissa shows the bias current and the ordinate shows ($\Delta Im/\Delta Ib$). This characteristic view is obtained from the characteristic curved lines in FIGS. 11 and 12.

The inventors noted that in FIGS. 11 and 12, characteristic deterioration in a semiconductor laser element appears as a shift in a characteristic curved line. In FIG. 11, at a certain bias current Ib, the differential coefficient ($\Delta Ib/\Delta T)_0$ of the characteristic curved line $Ib_0$ is substantially equal to the differential coefficient ($\Delta Ib/\Delta T)_1$ of the characteristic curved line $Ib_1$. This indicates that the characteristic curved line in FIG. 13 does not alter in accordance with the characteristic deterioration of the semiconductor laser element. Thus, according to the methods of this embodiment, not only is control of the light emission power and extinction ratio toward a constant value possible, but also characteristic deterioration in a semiconductor laser element may be compensated.

The function f is determined according to the following procedure. It was learned from an experiment conducted by the inventors that production lot dependence is stronger in this function than the dependence of each individual laser diode element. It is therefore preferable for the function f to be determined per production lot.

Up to this point, descriptions have been given referring to the bias current Ib, but since the differential coefficient ($\Delta Im/\Delta T)_0$ of the characteristic curved line $Im_0$ is substantially equal to the differential coefficient ($\Delta Im/\Delta T)_1$ of the characteristic curved line $Im_1$ at a certain modulation current Im, description may also be applied to the modulation current Im.

Next, an example of a method for adjusting a laser diode control circuit will be described such that operations are performed as described in the aforementioned embodiments.

(1) Maintain the laser diode control circuit to be adjusted at a predetermined environment temperature.

(2) Adjust the bias current and modulation current to obtain a desired optical output power and also to obtain a desired extinction ratio. Store a value corresponding to these current values in the storage means within the laser diode control circuit. Provide these values as initial values when the laser diode control circuit is to be operated correctly.

(3) Measure the photocurrent from the monitoring photodetector. Store a value corresponding to this photocurrent in the storage means (see number 36 in FIG. 2) within the laser diode control circuit. Provide this value as a reference value when the laser diode control circuit is to be operated correctly.

As a result of these processes, a laser diode control circuit is provided in which the individual differences between the bias current and modulation current of the semiconductor laser element and the reception sensitivity of the monitoring photodetector are adjusted.

It is clear from the description up to this point that if the bias current and modulation current are adjusted and the control function f is determined such that a predetermined optical output power and extinction ratio are outputted at a certain reference point, control can be performed such that the optical output power and extinction ratio of the laser diode are brought close to constant values over a wide temperature range.

Eighth Embodiment

Figure 14:
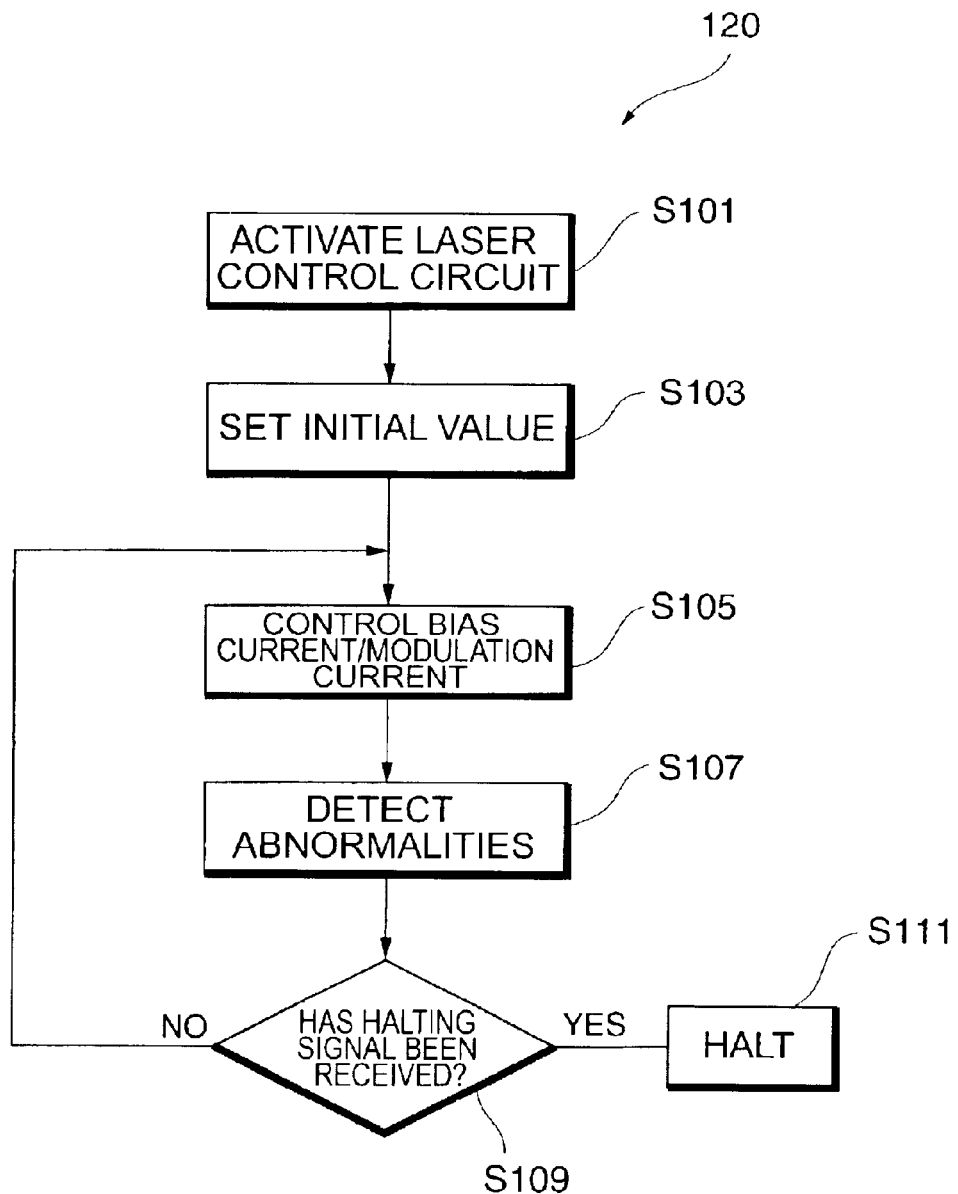
FIG. 14 is a flowchart illustrating a laser diode control method.

FIG. 14 is a flowchart showing a method of controlling a laser diode. In the flowchart 120, the laser diode control circuit is activated in step S101, and in step S103 the initial value setting means is activated such that the initial value for controlling the bias current and modulation current is set. In step S105, following the appropriate setting of the initial value, the function f is used to perform control of the bias current and modulation current on the basis of the photocurrent value from the photodetector. In step S107, abnormalities in the parameters for controlling the laser diode control circuit are detected. Then, in step S109, a judgment is made as to whether the halting signal has been received via the interface portion. If the halting signal has been received, the halting means is activated in step S111, whereby the operations of the laser diode control circuit are halted. If the halting signal has not been received, processing returns to step S105 and steps S105, S107, and S109 are repeated until the halting signal is received. Note that the functions expressed by the control process shown in FIG. 14 may be realized using an interrupt function.

Figure 15:
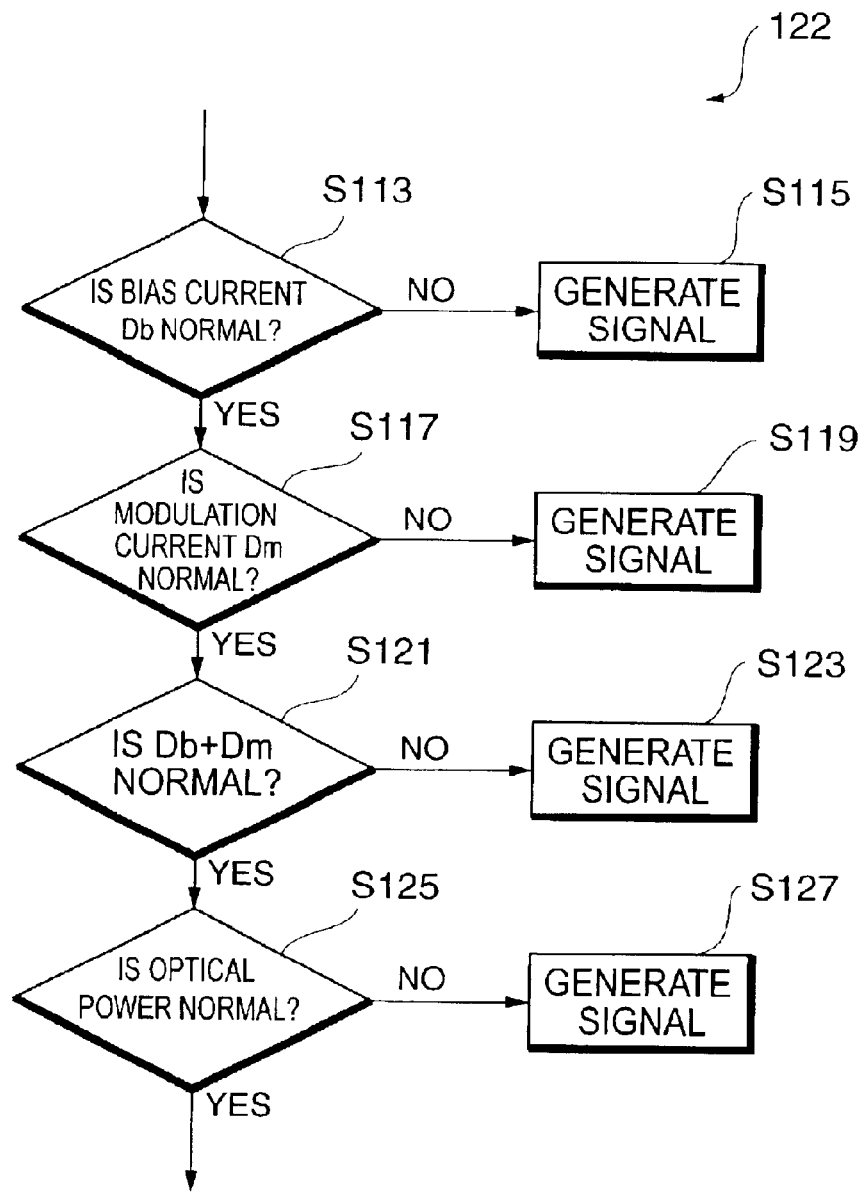
FIG. 15 is a flowchart illustrating an abnormality detection step in detail.

FIG. 15 is a flowchart 122 illustrating step S107 in detail. In the abnormality detection step, a judgment is made in step S113 as to whether the bias current value is normal. If the judgment result indicates the presence of abnormalities, a signal indicating the presence of abnormalities in the bias current is generated in step S115. If the judgment result indicates that the bias current value is normal, a judgment is made in step S117 as to whether the modulation current value is normal. If this judgment result indicates the presence of abnormalities, a signal indicating the presence of abnormalities in the modulation current is generated in step S119. If the judgement result indicates that the modulation current value is normal, a judgment is made in step S121 as to whether the sum of the bias current and the modulation current is normal. If this judgment result indicates the presence of abnormalities, a signal indicating the presence of abnormalities in the sum of the currents is generated in step S123. If the judgment result indicates that the sum of the currents is normal, a judgment is made in step S125 as to whether the optical output power is normal. If this judgment result indicates the presence of abnormalities, a signal indicating the presence of abnormalities in the optical output power is generated in step S127. If the judgment result indicates that the optical output power is normal, the abnormality detection step S107 ends. Note that in the abnormality detection step S107, a part of the aforementioned detection operations may be performed.

Figure 16:
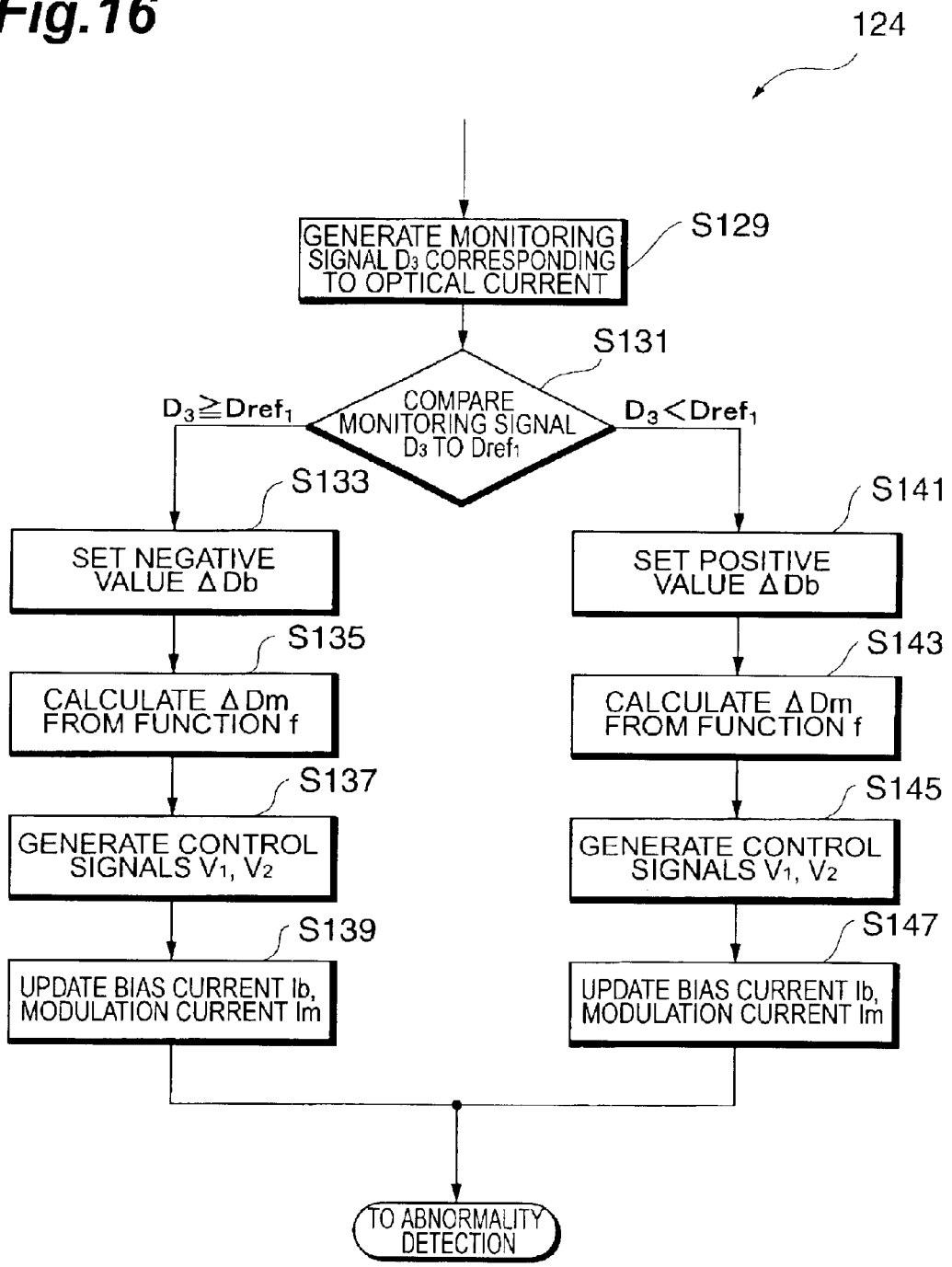
FIG. 16 is a flowchart illustrating a bias current and modulation current control procedure.

FIG. 16 is a flowchart 124 illustrating the control procedure of step S105. In step S105, control of the bias current and modulation current is performed from the appropriate initial values of the bias current and modulation current on the basis of the photocurrent value from the monitoring photodetector. In step S129, a monitoring signal $D_3$ which corresponds to the photocurrent from the monitoring photodetector is generated. Then, in step S131, the monitoring signal $D_3$ is compared to $D_{ref1}$.

When the comparison result indicates $D_3 \geq D_{ref1}$ (when the photocurrent is equal to or greater than a predetermined value), a negative value of $\Delta Db$ is generated in step S133. In step S135, $\Delta Dm$ is calculated from the negative value (a value which is set to decrease the bias current) of $\Delta Db$ and Db using the function f. Then, in step S137, the first and second control signals $V_1$, $V_2$ are generated from $\Delta Db$, $\Delta Dm$, Db, and Dm. In step S139, the bias current Ib and modulation current Im are generated on the basis of the first and second control signals $V_1$, $V_2$. This current is applied to the laser diode. The light from the laser diode is then inputted into the monitoring photodetector.

When the comparison result indicates $D_3 < D_{ref1}$ (when the photocurrent is less than a predetermined value), a positive value (a value which is set to increase the bias current) of $\Delta Db$ is generated in step S141. In step S143, $\Delta Dm$ is calculated from the positive value of $\Delta Db$ and Db using the function f. Then, in step S145, the first and second control signals $V_1$, $V_2$ are generated from $\Delta Db$, $\Delta Dm$, Db, and Dm. In step S147, the bias current Ib and modulation current Im are generated on the basis of the first and second control signals $V_1$, $V_2$. This current is applied to the laser diode. The light from the laser diode is then inputted into the monitoring photodetector.

When steps S139 and S147 are complete, control moves to the abnormality detection step. Note that abnormality detection may be realized using interrupt processing.

FIG. 17 is a flowchart 126 illustrating in detail another control procedure of step S105. In step S105, control of the bias current and modulation current is performed from the appropriate initial values of the bias current and modulation current on the basis of the photocurrent value from the monitoring photodetector. In step S149, a monitoring signal $D_4$ which corresponds to the photocurrent from the monitoring photodetector is generated. Then, in step S151, the monitoring signal $D_4$ is compared to a threshold $D_{ref2}$. For the purposes of detection in this embodiment, the difference between the monitoring signal $D_4$ and $D_{ref2}$ is produced and the absolute value $(D_4-D_{ref2})_{ABS}$ of this difference and a threshold $D_{ref3}$ are compared.

If the comparison result indicates $(D_4-D_{ref2})_{ABS} >$ threshold $D_{ref3}$ (if the amount of change in the photocurrent is significant), the monitoring signal $D_4$ is compared with $D_{ref2}$ in step S161.

If the comparison result indicates $D_4 > D_{ref2}$ (if the photocurrent is greater than a predetermined value), a negative value (a value which is set to decrease the bias current) of $\Delta Db$ is generated in step S171. In step S173, $\Delta Dm$ is calculated from $\Delta Db$ and Db using the function f. Then, in step S175, the first and second control signals $V_1$, $V_2$ are generated from $\Delta Db$, $\Delta Dm$, Db, and Dm. In step S177, the bias current Ib and modulation current Im are generated on the basis of the first and second control signals $V_1$, $V_2$. This current is applied to the laser diode. The light from the laser diode is then inputted into the monitoring photodetector.

If the comparison result indicates $D_4 < D_{ref2}$ (if the photocurrent is smaller than a predetermined value), a positive value (a value which is set to increase the bias current) of $\Delta Db$ is generated in step S163. In step S165, $\Delta Dm$ is calculated from $\Delta Db$ and Db using the function f. Then, in step S167, the first and second control signals $V_1$, $V_2$ are generated from $\Delta Db$, $\Delta Dm$, Db, and Dm. In step S169, the bias current Ib and modulation current Im are generated on the basis of the first and second control signals $V_1$, $V_2$. This current is applied to the laser diode. The light from the laser diode is then inputted into the monitoring photodetector.

If the comparison result indicates $(D_4-D_{ref2})_{ABS} <$ threshold $D_{ref3}$ (if the amount of change in the photocurrent is not significant) in step S153, $\Delta Db$ and $\Delta Dm$ are set so as to maintain the current bias current and modulation current. In step S153, the bias current Ib and modulation current Im are generated on the basis of the first and second control signals $V_1$, $V_2$. This current is applied to the laser diode. The light from the laser diode is then inputted into the monitoring photodetector.

When steps S169, S177, and S153 are complete, control moves to the abnormality detection step. Note that abnormality detection may be realized using interrupt processing.

A method for controlling a laser diode was described with reference to FIGS. 14 through 17, but the function f described in the embodiments prior to this embodiment may also be applied.

According to the laser diode control circuit and laser diode control method of this embodiment, control of the optical output power and extinction ratio of the laser light generating portion is performed. During this control, neither peak detection of the output signals from the monitoring photodetector nor monitoring of the temperature of the laser light generating portion is performed. Such peak detection becomes more difficult as the transmission rate increases. Further, temperature monitoring of the laser light generating portion, which becomes meaningless as the semiconductor light source of the laser light generating portion alters with age is not performed.

According to the laser diode control circuit and laser diode control method of this embodiment, a circuit which controls the optical output power and extinction ratio to constant levels in respect of changes in the ambient temperature of the laser diode or changes with time can be efficiently provided. In short, adjustment work of individual differences among laser diodes can be conducted efficiently when optical transmitters are manufactured in large quantities.

The principles of the present invention were illustrated and described in preferred embodiments. However, it will be recognizable to persons skilled in the art that modifications to the disposition and details of the present invention may be made without deviating from these principles. For example, the laser diode control circuit illustrated in the embodiments is constituted by a bipolar transistor, but may be constituted by a Group III-V compound semiconductor transistor. Further, the method of realization of the function f is not limited to the approximated function described in these embodiments, and may be modified according to necessity.

Also in the embodiments, a control method using a function for bringing the optical output power and extinction ratio close to a constant value was described, but the present invention may also be applied to a control method using a function which is defined such that the light emission power displays a predetermined dependence and the extinction ratio displays a predetermined dependence. Also in these embodiments, a case in which a CPU processor is used as the control portion was described, but the control portion may be constituted by a digital logic circuit. In addition, the laser light generating portion is not limited to one which includes a semiconductor laser element, but may also include a semiconductor optical amplifying element or be integrated with an EA modulation element.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims. Accordingly, the rights are claimed to all amendments and modifications arising from the scope of the patent claims and the spirit thereof.

What is claimed is:

1. A laser diode control circuit comprising:
   a load portion for generating a signal corresponding to a photocurrent which is generated by a photodetector in accordance with the optical power of the light received from a laser light generating portion; and
   a control portion for generating a first control signal using values which correspond to $\Delta X$ and X to modify one of the bias current Ib and the modulation current Im and for generating a second control signal using values which correspond to $\Delta Y$ and Y to modify the other of the bias current Ib and the modulation current Im, wherein $\Delta X$ is defined in accordance with the result of a comparison between a value corresponding to said signal and a reference value, $\Delta Y$ is generated by a function $f(X,\Delta X)=\Delta Y$ defined such that the light emission power displays a predetermined dependence and the extinction ratio displays a predetermined dependence, a set of variables $(X,Y,\Delta X,\Delta Y)$ is one of either (Db, Dm, $\Delta$Db, $\Delta$Dm) or (Dm, Db, $\Delta$Dm, $\Delta$Db), the symbol Db indicating a value corresponding to a bias current Ib, the symbol Dm indicating a value corresponding to a modulation current Im, the symbol $\Delta$Db indicating a value corresponding to an amount of change $\Delta$Ib in the bias current Ib, and the symbol $\Delta$Dm indicating a value corresponding to an amount of change $\Delta$Im in the modulation current Im;
   a bias current circuit portion for generating the bias current Ib to be provided to said laser light generating portion in accordance with said first control signal; and
   a modulation current circuit portion for generating the modulation current Im to be provided to said laser light generating portion in accordance with said second control signal.

2. The laser diode control circuit according to claim 1, wherein said control portion comprises:
   first means for generating the amount of change $\Delta Y$ in accordance with said function $f(X,\Delta X)=\Delta Y$ and in accordance with the amount of change $\Delta X$ which is defined according to the result of the comparison between the value corresponding to said signal and the reference value;
   second means for generating the first control signal from values corresponding to said $\Delta$Db and said Db; and
   third means for generating the second control signal from values corresponding to said $\Delta$Dm and said Dm.

3. The laser diode control circuit according to claim 1, wherein said control portion comprises:
   an A/D conversion circuit portion for receiving said signal and generating a digital value corresponding to said signal;
   a first D/A conversion circuit portion for generating an analog value corresponding to a digital value of Db+$\Delta$Db; and
   a second D/A conversion circuit portion for generating an analog value corresponding to a digital value of Dm+$\Delta$Dm.

4. The laser diode control circuit according to claim 1, wherein said function f is an approximated function of a function defined such that the light emission power becomes constant and the extinction ratio becomes constant.

5. The laser diode control circuit according to claim 2, wherein said first means comprises:
   first storage means for storing a value of $\Delta Y/\Delta X$ in relation to the range of said variable X;
   comparing means for comparing a monitoring signal which corresponds to the photocurrent from said photodetector with a reference value;
   first calculation means for determining the value of $\Delta Y$ on the basis of the storage content of said first storage means and on the basis of a value of $\Delta X$ which is set such that said optical power of the light increases when the result of the comparison in said comparing means indicates that said optical power of the light is smaller than a predetermined value; and
   second calculation means for determining the value $\Delta Y$ on the basis of the storage content of said first storage means and on the basis of a value of $\Delta X$ which is set such that said optical power of the light decreases when said comparison result indicates that said optical power of the light is greater than a predetermined value.

6. The laser diode control circuit according to claim 5, wherein said first storage means stores a constant $(\Delta Y/\Delta X)_0$ in respect of the entire range of the variable X.

7. The laser diode control circuit according to claim 5, wherein said first storage means stores a constant $(\Delta Y/\Delta X)_n$ in association with each of a plurality of regions $(R_n: n \geq 1)$ into which the entire range of the variable X is divided.

8. The laser diode control circuit according to claim 2, wherein said first means comprises:
   first generating means for generating a value $(\Delta Y/\Delta X)_m$ which is determined by a linear function f in relation to X in an arbitrary region $R_m$ from among a plurality of regions $(R_m: m \geq 1)$ into which the entire range of the variable X is divided;
   comparing means for comparing a monitoring signal corresponding to the photocurrent from said photodetector and a reference value;
   second generating means for determining the value $\Delta Y$ on the basis of the value of $(\Delta Y/\Delta X)_m$ and on the basis of a value of $\Delta X$ which is set such that said optical power of the light increases when the result of the comparison in said comparing means indicates that said optical power of the light is smaller than a predetermined value; and
   third generating means for determining the value $\Delta Y$ on the basis of the value of $(\Delta Y/\Delta X)_m$ and on the basis of a value of $\Delta X$ which is set such that said optical power of the light decreases when said comparison result indicates that said optical power of the light is larger than a predetermined value.

9. The laser diode control circuit according to claim 1, wherein said control portion comprises means for providing values of $\Delta X$ which can differ in accordance with the value of the variable X.

10. The laser diode control circuit according to claim 1, wherein said control portion comprises second storage means for storing a value of Db corresponding to the current bias current Ib and a value of Dm corresponding to the current modulation current Im.

11. The laser diode control circuit according to claim 1, wherein said control portion comprises fourth means for maintaining X and Y when the absolute value of the difference between the value corresponding to said signal and the reference value is equal to or less than a threshold.

12. The laser diode control circuit according to claim 1, wherein said control portion comprises fifth means for generating said first and second control signals such that said bias current and said modulation current are not increased when either the result of a comparison between said Db and a bias current threshold indicates that the bias current is excessive high or the result of a comparison between said Dm and a modulation current threshold indicates that the modulation current is excessive high.

13. The laser diode control circuit according to claim 1, wherein said control portion comprises sixth means for generating said first and second control signals such that said bias current and said modulation current are not decreased when either the result of a comparison between said Db and a bias current threshold indicates that the bias current is excessively low or the result of a comparison between said Dm and a modulation current threshold indicates that the modulation current is excessively low.

14. The laser diode control circuit according to claim 1, wherein said control portion further comprises initial value setting means for providing a set of a plurality of control signals (first control signal, second control signal)$_i$ (i=1 ... n) in succession to activate the laser diode control circuit.

15. The laser diode control circuit according to claim 1, wherein said control portion comprises:
  means for comparing any one of said Db, said Dm, or the sum SUM of said Db and said Dm with a threshold, and generating a first comparison signal indicating the result of this comparison; and
  means for generating a first alarm signal indicating that an overcurrent is present in the laser light generating portion when this first comparison signal indicates that the current is excessive.

16. The laser diode control circuit according to claim 15, wherein said control portion comprises means for halting said first alarm signal when said first alarm signal is generated if the first comparison signal indicates that the current is normal.

17. The laser diode control circuit according to claim 1, wherein said control portion comprises:
  means for comparing a monitoring signal which corresponds to said photocurrent with a threshold and generating a third comparison signal which indicates the result of this comparison; and
  means for generating a second alarm signal indicating a decrease in light emission power in the laser light generating portion when said third comparison signal indicates excessively low power.

18. The laser diode control signal according to claim 17, wherein said control portion comprises means for halting said second alarm signal when said second alarm signal is generated if said third comparison signal indicates normal power.

19. The laser diode control signal according to claim 1, wherein said control portion comprises nonvolatile memory, and the laser diode control circuit further comprises:
  an interface portion for communicating with an external device; and
  means connected to said interface portion for performing a write operation to said nonvolatile memory.

20. The laser diode control circuit according to claim 1, further comprising:
  an interface portion for communicating with an external device;
  means for halting the generation of light in said laser light generating portion in response to a signal from said interface portion; and
  means for commencing the generation of light in said laser light generating portion in response to a signal from said interface portion.

21. The laser diode control circuit according to claim 1, further comprising:
  a laser light generating portion comprising a semiconductor light source; and
  a monitoring photodetector disposed so as to receive light from said laser light generating portion for generating a photocurrent corresponding to the amount of received light.

22. A laser diode control method comprising the steps of:
  generating a signal which corresponds to a photocurrent from a photodetector for detecting the optical power of the light from a laser light generating portion;
  generating a first control signal using $\Delta X$ and X for controlling one of the bias current and the modulation current and generating a second control signal using $\Delta Y$ and Y for controlling the other of the bias current and the modulation current, wherein a value $\Delta X$ is defined in accordance with the result of a comparison between a value corresponding to said signal and a reference value, a value $\Delta Y$ is generated by a function $f(X,\Delta X)=\Delta Y$ defined such that the light emission power displays a predetermined dependence and the extinction ratio displays a predetermined dependence, a set of variables $(X,Y,\Delta X,\Delta Y)$ is one of either $(Db,Dm,\Delta Db,\Delta Dm)$ or $(Dm,Db,\Delta Dm,\Delta Db)$, the symbol Db indicating a value corresponding to the bias current Ib, the symbol Dm indicating the value corresponding to the modulation current Im, the symbol $\Delta Db$ indicating a value corresponding to an amount of change $\Delta Ib$ in the bias current, and the symbol $\Delta Dm$ indicating a value corresponding to an amount of change $\Delta Im$ in the modulation current; and
  driving said laser light generating portion using the bias current and modulation current generated on the basis of said first and second control signals.

23. The method according to claim 22, wherein said generating steps of:
  comparing the absolute value of the difference between the value corresponding to said signal and the reference value with a predetermined value;
  when this absolute value exceeds the predetermined value, generating the first control signal using $\Delta X$ and X for controlling one of the bias current and the modulation current, and generating the second control signal using $\Delta Y$ and Y for controlling the other of the bias current and the modulation current, wherein the value $\Delta X$ is defined in accordance with the result of the comparison between the value corresponding to said signal and the reference value, and the value $\Delta Y$ is generated by the function $f(X,\Delta X)=\Delta Y$ defined such that the light emission power displays the predetermined dependence and the extinction ratio displays the predetermined dependence; and when this absolute value is equal to or less than the predetermined value, maintaining said first and second control signals.

24. The method according to claim 22, wherein said function f is defined as a constant $(\Delta Y/\Delta X)_0$ in respect of the entire range of the variable X.

25. The method according to claim 22, wherein said function f is defined so as to generate a constant $(\Delta Y/\Delta X)_n$ in association with each of a plurality of regions $(R_n: n \geq 1)$ into which the entire range of the variable X is divided.

26. The method according to claim 22, wherein said function f is defined so as to generate a value $(\Delta Y/\Delta X)_m$ using a linear function in relation to X in an arbitrary region $R_m$ from among a plurality of regions $(R_m: m \geq 1)$ into which the entire range of the variable X is divided.

* * * * *